United States Patent
McKinney et al.

(10) Patent No.: US 12,162,117 B2
(45) Date of Patent: Dec. 10, 2024

(54) PEDESTAL POLISHING APPARATUS

(71) Applicant: Lam Research Corporation, Fremont, CA (US)

(72) Inventors: Robert McKinney, Fremont, CA (US); Sushanth Kondi, Bangalore (IN); Mahendra Byrapura Manjunath, Bangalore (IN); Gary B. Lind, Penn Valley, CA (US); Vinayakaraddy Gulabal, Yadgir (IN); Andrew Paul Eib, San Jose, CA (US); Eddie Ze Thean Ooi, Singapore (SG); Vishnu Sai Yalamarty, Singapore (SG)

(73) Assignee: Lam Research Corporation, Fremont, CA (US)

( * ) Notice: Subject to any disclaimer, the term of this patent is extended or adjusted under 35 U.S.C. 154(b) by 228 days.

(21) Appl. No.: 17/784,543

(22) PCT Filed: Dec. 11, 2020

(86) PCT No.: PCT/US2020/064596
§ 371 (c)(1),
(2) Date: Jun. 10, 2022

(87) PCT Pub. No.: WO2021/119485
PCT Pub. Date: Jun. 17, 2021

(65) Prior Publication Data
US 2023/0016450 A1   Jan. 19, 2023

(30) Foreign Application Priority Data
Dec. 13, 2019  (IN) .............................. 201931051873

(51) Int. Cl.
*B24B 53/017*  (2012.01)
*B24B 37/34*   (2012.01)

(52) U.S. Cl.
CPC ............ *B24B 53/017* (2013.01); *B24B 37/34* (2013.01)

(58) Field of Classification Search
CPC ......... B24B 7/228; B24B 7/186; B24B 23/02; B24B 23/024; B24B 23/028;
(Continued)

(56) References Cited

U.S. PATENT DOCUMENTS

| | | | |
|---|---|---|---|
| 3,061,982 A | 11/1962 | Isaac | |
| 6,238,277 B1 * | 5/2001 | Duncan | A47L 11/16 451/271 |
| 6,454,640 B1 * | 9/2002 | Siedler | B24B 23/03 451/357 |
| 6,769,969 B1 * | 8/2004 | Duescher | B24B 1/00 451/36 |

(Continued)

FOREIGN PATENT DOCUMENTS

| | | |
|---|---|---|
| CN | 114981037 | 8/2022 |
| JP | 2023505781 | 2/2023 |

OTHER PUBLICATIONS

International Application Serial No. PCT/US2020/064596, International Search Report mailed Mar. 15, 2021, 3 pgs.
(Continued)

*Primary Examiner* — Robert F Neibaur
(74) *Attorney, Agent, or Firm* — Schwegman Lundberg & Woessner, P.A.

(57) ABSTRACT

A cleaning apparatus for a vacuum pedestal and method of cleaning a pedestal used in semiconductor device fabrication are described. The apparatus has a baseplate, a collar attached to the baseplate, a cap disposed on the collar, and a shaft that extends from the collar through the cap, collar and baseplate. A manual rotatable handle is attached to a shaft portion that extends from the cap. Motion of the handle in a downward direction is impeded by the cap. A disk is attached to a lower portion of the shaft and is separated from a bottom of the baseplate due to weighted rings, which are attached to the disk and surround the lower portion of the
(Continued)

shaft such that a vertical float is present between the shaft and the cap. At least one abrasive pad is attached to the disk to remove build-up on the underlying pedestal surface.

24 Claims, 24 Drawing Sheets

(58) Field of Classification Search
CPC ..... B24B 23/0076; B24B 37/04; B24B 37/12; B24B 37/20; B24B 37/34; B24B 53/003; B24B 53/007; B24B 53/017; B24B 53/02; B24B 53/12; B24B 55/052; B24B 55/06; B24B 55/102
USPC ....... 451/443, 56, 41, 89, 63, 278, 287, 353, 451/456, 524, 548, 557; 15/210.1
See application file for complete search history.

(56) References Cited

U.S. PATENT DOCUMENTS

| | | | |
|---|---|---|---|
| 7,089,782 B2 | 8/2006 | Lin et al. | |
| 2005/0221729 A1 | 10/2005 | Lee | |
| 2007/0232207 A1* | 10/2007 | Palushi | B24B 27/0076 |
| | | | 451/350 |
| 2019/0160622 A1* | 5/2019 | Barth | B24B 7/184 |

OTHER PUBLICATIONS

International Application Serial No. PCT/US2020/064596, Written Opinion mailed Mar. 15, 2021, 5 pgs.

"International Application Serial No. PCT US2020 064596, International Preliminary Report on Patentability mailed Jun. 23, 2022", 7 pgs.

* cited by examiner

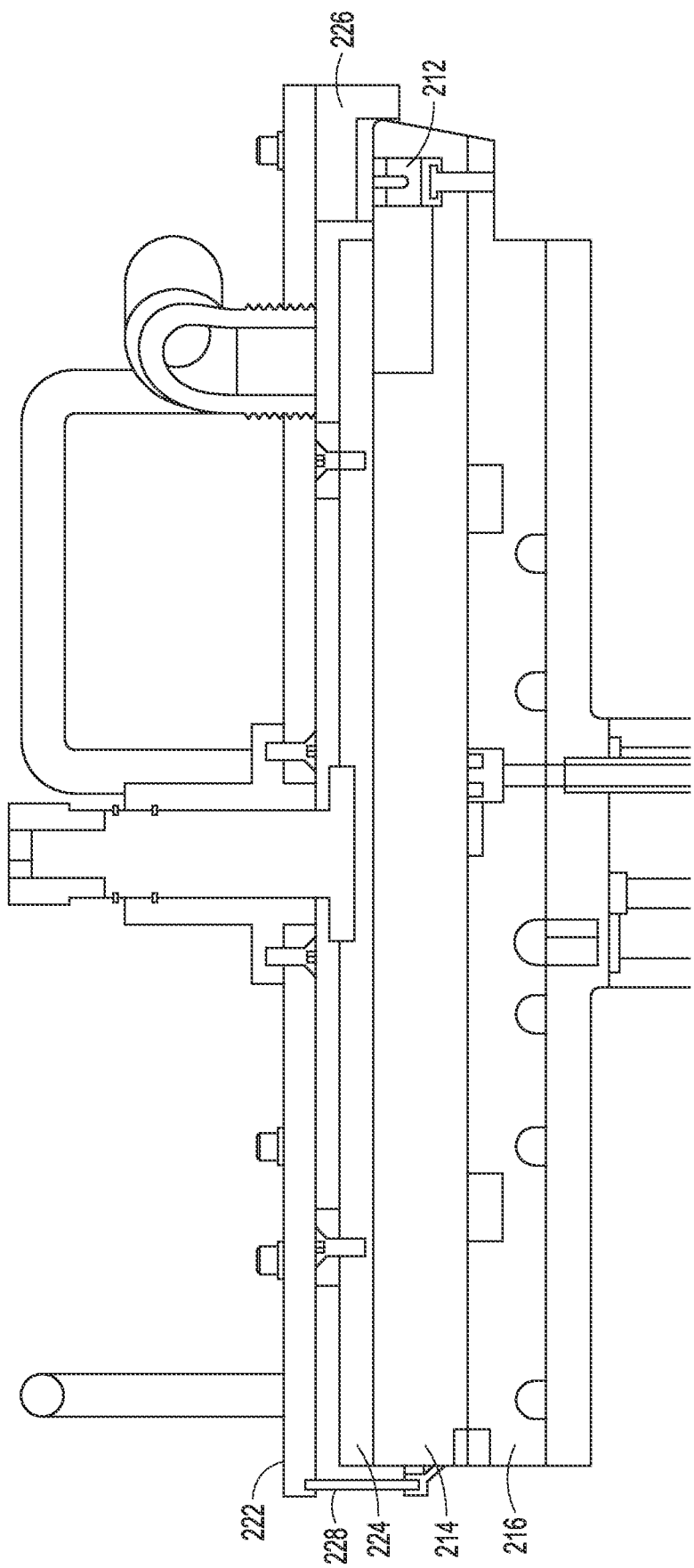

PEDESTAL POLISHING APPARATUS

CLAIM OF PRIORITY

This application is a U.S. National Stage Filing under 35 U.S.C. 371 from International Application No. PCT/US2020/064596, filed on Dec. 11, 2020, and published as WO 2021/119485 A1 on Jun. 17, 2021, which claims the benefit of priority to Indian patent application Ser. No. 20/1931051873, filed Dec. 13, 2019, each of which is incorporated herein by reference in its entirety.

TECHNICAL FIELD

The present disclosure generally relates to cleaning technology for substrate processing. Some embodiments relate to cleaning technology for a vacuum pedestal chuck. Some specific embodiments relate to a cleaning apparatus for a pedestal chuck used during semiconductor wafer processing.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Semiconductor device fabrication is a continually increasingly complicated and involved set of processes, involving a large number of deposition, etching and removal steps. In addition to processes that focus on device fabrication on semiconductor wafers, the use of various gasses and other chemicals over time may result in various cleaning processes being undertaken to clean the processing chambers and equipment therein.

SUMMARY

In some embodiments, a cleaning apparatus comprises a baseplate having a baseplate hole extending therethrough. A collar is attached to the baseplate. The collar extends perpendicularly from the baseplate and through the baseplate hole. The collar has a collar hole extending perpendicularly through a center of the collar from a top of the collar to a bottom of the collar. A cap has a cap hole extending therethrough. The cap is disposed on the collar such that a center of the cap hole and a center of the collar hole are collinear. A shaft extends from the top of the collar through the cap hole, the collar hole and the baseplate hole. A rotatable handle or crank is attached to an upper portion of the shaft that extends from the cap hole. Motion of the rotatable handle in a direction of extension of the collar hole is impeded by the cap. A disk is attached to a lower portion of the shaft and separated from a bottom of the baseplate. At least one abrasive pad is attached to the disk to remove buildup on a surface of an underlying pedestal.

In some embodiments, the collar hole comprises a first and a second collar hole portion. The first collar hole portion is proximate to the cap and has a first collar diameter. The second collar hole portion is distal from the cap and has a second collar diameter smaller than the first collar diameter. The shaft comprises a first and second shaft portion in addition to the lower portion. The first shaft portion extends from a top of the shaft through the cap hole into the first collar hole portion and has a first shaft diameter. The second shaft portion extends from the first collar hole portion through the baseplate hole and has a second shaft diameter larger than the first shaft diameter. The lower portion of the shaft has a third shaft diameter larger than the second shaft diameter.

In some embodiments, a weight is attached to the disk to provide an increased normal load on the abrasive pads, so that the polishing action is accelerated. A vertical float is present between a top of the second shaft portion and a top of the second collar hole portion to provide the separation between the disk and the bottom of the baseplate.

In some embodiments, the weight is a weighted ring surrounding the lower portion of the shaft.

In some embodiments, the rotatable handle has a manipulating handle and a coupling mechanism. The coupling mechanism has a square hole through which the first shaft portion passes. The first shaft portion has a square cross-section.

In some embodiments, the second shaft portion has a circular cross-section.

In some embodiments, the first shaft portion has a first shaft portion hole therein. A ball-lock pin is disposed in the first shaft portion hole to retain the coupling mechanism and the rotatable handle.

In some embodiments, the at least one abrasive pad comprises a plurality of individual abrasive pads having a pad diameter smaller than a disk diameter of the disk, disposed to entirely cover an area of the disk over a single revolution.

In some embodiments, exhaust ports are disposed on a top of the baseplate and connected to exhaust holes extending through the baseplate. The disk comprises a plurality of spaced disk holes extending therethrough. The number of disk holes is larger than the number of exhaust ports.

In some embodiments, the individual abrasive pads are disposed between the disk holes and arranged such that an arc formed by an outer edge of one of the individual abrasive pads is tangential to an arc formed by an inner edge of another of the individual abrasive pads.

In some embodiments, the individual abrasive pads are disposed between the disk holes and arranged such that a first set of the individual abrasive pads are disposed linearly in a first direction and a second set of the individual abrasive pads are disposed linearly in a second direction perpendicular to the first direction, the first set of the individual abrasive pads in contact and the second set of the individual abrasive pads separated.

In some embodiments, the baseplate is substantially circular and has a plurality of extensions extending outward from a circumference of the circle. Feet extend from the extensions in a direction of the disk. The feet are configured to couple with engaging members of the underlying pedestal.

In some embodiments, the baseplate and disk are substantially circular. A diameter of the baseplate is larger than a diameter of the disk. The baseplate has a groove formed in a bottom of the baseplate. The groove has a larger diameter than the diameter of the disk. A skirt is retained in the groove and extends from the baseplate beyond the disk.

In some embodiments, a gasket is disposed on an end of the skirt to seal a pedestal on which the cleaning apparatus is disposed.

In some embodiments, a cleaning apparatus comprises a baseplate having a baseplate hole extending therethrough and a cap attached to the baseplate. The cap has a cap hole extending therethrough. A bushing is disposed between the cap and the baseplate. The bushing is disposed in the baseplate hole and has a bushing hole extending therethrough. A spindle has an upper portion extending through the bushing hole into the cap hole. A crank plate has a central portion attached to a lower portion of the spindle and extending in a direction parallel with the baseplate to a distal portion. A disk collar is attached to the distal portion of the crank plate. A disk is attached to the disk collar. The disk has a diameter that is at least about one half a diameter of the baseplate. An abrasive pad is attached to the disk.

In some embodiments, the baseplate and disk are substantially circular. A diameter of the baseplate is larger than a diameter of the disk. The baseplate has a groove formed in a bottom of the baseplate. The groove has a larger diameter than the diameter of the disk. A skirt is retained in the groove and extends from the baseplate beyond the disk.

In some embodiments, a gasket is disposed on an end of the skirt to seal a pedestal on which the cleaning apparatus is disposed.

In some embodiments, the baseplate is substantially circular and has a plurality of extensions extending inward from a circumference of the circle. Feet extend from the extensions in a direction of the disk, the feet configured to couple with engaging members of a pedestal on which the cleaning apparatus is disposed.

In some embodiments, exhaust holes extend through the baseplate.

In some embodiments, the disk collar comprises a swivel joint that keeps the disk level with a pedestal on which the cleaning apparatus is disposed.

In some embodiments, a manual crank has a handle and is attached to an upper portion of the spindle.

In some embodiments, a motor spindle is attached to an upper portion of the spindle, and a motor is configured to drive the motor spindle.

In some embodiments, a cleaning apparatus comprises a baseplate having a baseplate hole extending therethrough and a bushing attached to the baseplate. The bushing extends perpendicularly from the baseplate and through the baseplate hole. The bushing has a bushing hole extending perpendicularly through a center of the bushing from a top of the bushing to a bottom of the bushing. A spindle extends from the bottom of the bushing through the baseplate and bushing holes, projecting from the top of the bushing. A rotatable handle is attached to an upper portion of the spindle that extends from the bushing. A disk is attached to a lower portion of the spindle and separated from a bottom of the baseplate. A bearing ring is disposed between the baseplate and disk to ease rotation of the disk. Abrasive pads are attached to the disk to remove build-up on a surface of an underlying pedestal.

In some embodiments, the spindle comprises a first, second and third spindle portion. The first spindle portion has a first spindle diameter. The second spindle portion extends from the bushing hole through the baseplate hole and from the top of the bushing. The second spindle portion has a second spindle diameter larger than the first spindle diameter. The third spindle portion is attached to the disk and has a third spindle diameter larger than the second spindle diameter.

In some embodiments, the rotatable handle comprises a manipulating handle and a coupling mechanism. The coupling mechanism has a square hole through which the first spindle portion passes. The first spindle portion has a square cross-section.

In some embodiments, the second spindle portion has a circular cross-section.

In some embodiments, the abrasive pads have a pad diameter smaller than a disk diameter of the disk, disposed to entirely cover an area of the disk over a single revolution.

In some embodiments, an exhaust port is disposed on a top of the baseplate and connected to an exhaust hole extending through the baseplate. The disk comprises a plurality of evenly (or unevenly) spaced disk holes extending therethrough. The abrasive pads are disposed between the disk holes and arranged such that an arc formed by an outer edge of one of the abrasive pads is tangential to an arc formed by an inner edge of another of the abrasive pads.

In some embodiments, the abrasive pads are disposed between the disk holes and arranged such that a first set of the abrasive pads are disposed linearly in a first direction and a second set of the abrasive pads are disposed linearly in a second direction perpendicular to the first direction, the first set of the abrasive pads in contact and the second set of the abrasive pads separated.

In some embodiments, the baseplate is substantially circular and has a plurality of extensions extending outward from a circumference of the circle. Feet extend from the extensions in a direction of the disk. The feet are configured to couple with engaging members of the underlying pedestal.

In some embodiments, the baseplate and disk are substantially circular. A diameter of the baseplate is larger than a diameter of the disk. The baseplate has a groove formed in a bottom of the baseplate. The groove has a larger diameter than the diameter of the disk. A skirt is retained in the groove and extends from the baseplate beyond the disk.

In some embodiments, a gasket is disposed on an end of the skirt to seal a pedestal on which the cleaning apparatus is disposed.

DESCRIPTION OF THE DRAWINGS

Some embodiments are illustrated by way of example and not limitation in the views of the accompanying drawings. Corresponding reference characters indicate corresponding parts throughout the several views. Elements in the drawings are not necessarily drawn to scale. The configurations shown in the drawings are merely examples, and should not be construed as limiting the scope of the disclosed subject matter in any manner.

FIG. 2C is a schematic cross-sectional view of the chamber of FIG. 2A.

DESCRIPTION

Figure 1A:
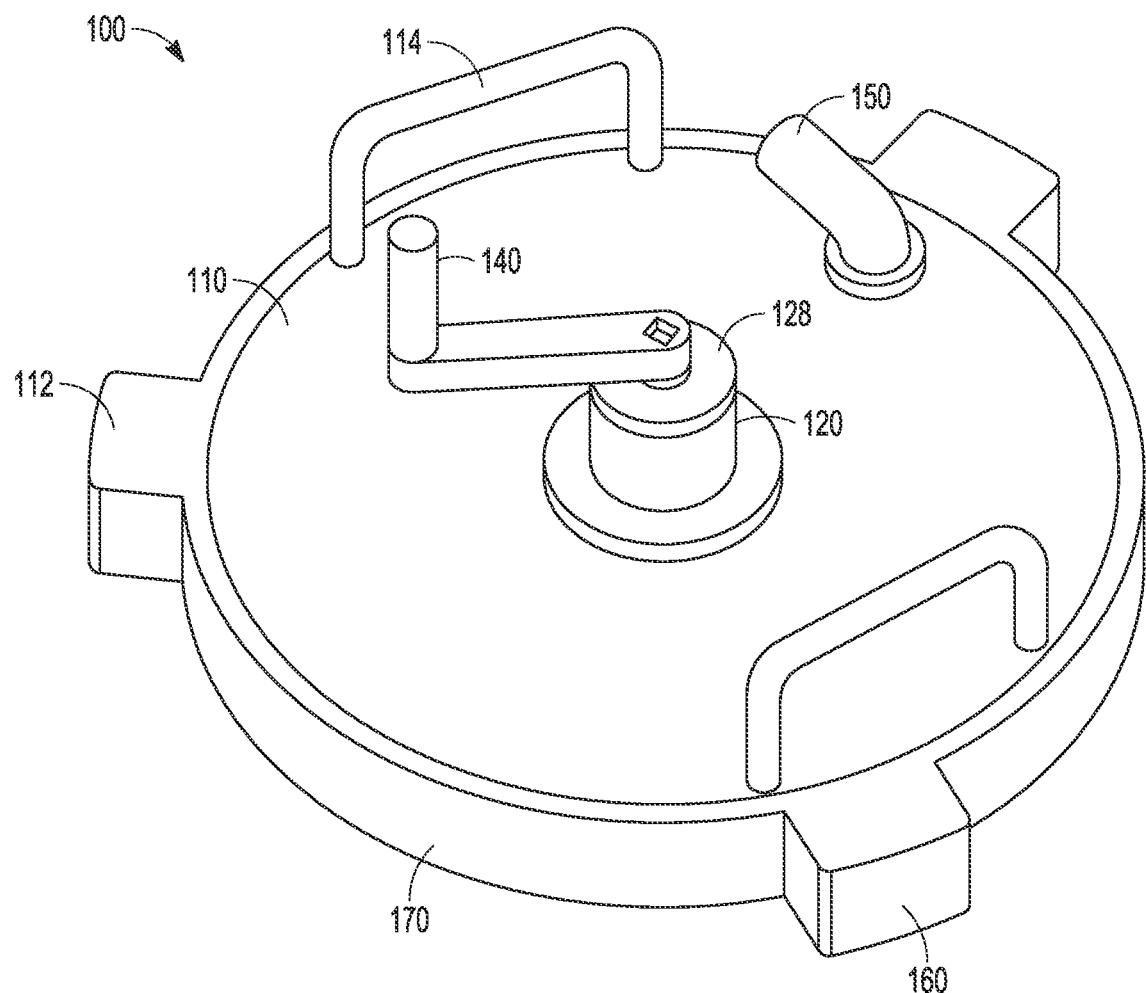
FIG. 1A is a perspective view of a top of a pedestal cleaning apparatus, according to an example embodiment.

The description that follows includes systems, methods, techniques, instruction sequences, and computing machine program products that embody illustrative embodiments of the present disclosure. In the following description, for purposes of explanation, numerous specific details are set forth in order to provide a thorough understanding of example embodiments. It will be evident, however, to one skilled in the art that the present inventive subject matter may be practiced without these specific details.

As above, semiconductor device uses a variety of gasses and other chemicals, which may result in additional operations being undertaken to clean the processing chambers and equipment therein. For example, in many steps of the device fabrication process, aluminum pedestals are used to retain the semiconductor wafers using a vacuum. As a result, it is desirable to keep the surface of the pedestal as uniform as possible.

During device fabrication however, tungsten is deposited on the pedestals. A plasma cleaning cycle is used in which fluorine radicals are released to clean the tungsten deposited on the pedestal, and within the fabrication chamber. Unfortunately, fluorine also reacts with the aluminum to form aluminum fluoride (AlF), which has the effect of roughening the surface of the pedestal. The roughening of the surface degrades the vacuum sealing of the wafer to the pedestal, allowing gases used during fabrication to leak under the ends of the wafer. The gas leakage causes further buildup at the pedestal surface, thus causing the vacuum clamping of the wafer to become increasingly ineffective over time. This degradation in vacuum clamping results in the wafer floating on the pedestal, causing non-uniform material deposition and reducing device yield. This also affects back-side gas flow for edge-exclusion, increasing the amount of area at the edge of the wafer that is rendered unusable.

In some cases, the pedestal may be polished by hand to eliminate the AlF. In particular, a sanding pad affixed to a hand-held (typically hockey-puck sized) fixture is then manually scrubbed over the pedestal in specified directions and for a specified number of times. A test wafer is clamped after every cleaning. If the clamping pressure is satisfactory, the polishing is stopped. If not, the process is continued, and another round of manual sanding is provided. The rate of material removal is dependent on how much force is being applied on the sanding pad, as well as on the skill of the technician, leading to variations in the amount of material removed. Moreover, pedestals are typically polished several times a year, depending on the number of wafers processed. Each time the pedestal is polished, several days of downtime results due to the fabrication chamber being open during cleaning and removing the contaminations introduced therein to again allow the chamber to reach the appropriate International Organization for Standardization (ISO) class, leading to an extended amount of downtime in addition to inconsistent cleaning performance and time-to-clean.

In various embodiments, a pedestal cleaning apparatus and method of cleaning a pedestal are described. As discussed herein, hand polishing may be used to remove AlF from the surface of a vacuum pedestal used to retain a semiconductor wafer for device processing. In some cases, an abrasive pad, such as a 3.5" diameter diamond-grit sanding pad, is scrubbed over the pedestal to remove the deposit. In some cases, the sanding pad diameter (3.5") is smaller than the diameter of the pedestal, which is typically 14", causing the process to be repeated several times across the surface of the pedestal. To avoid this issue and minimize the amount of time taken to polish the pedestal, it may be desirable to avoid the polishing altogether. This may be done by using, for example, a thin ceramic plate bonded to the surface of the pedestal with which the Tungsten does not interact. However, bonding materials have not yet been found that work at up to the highest temperature used during the fabrication process (about 500° C.) while accommodating the varying coefficients of thermal expansion (CTEs) of ceramics and aluminum.

Figure 1B:
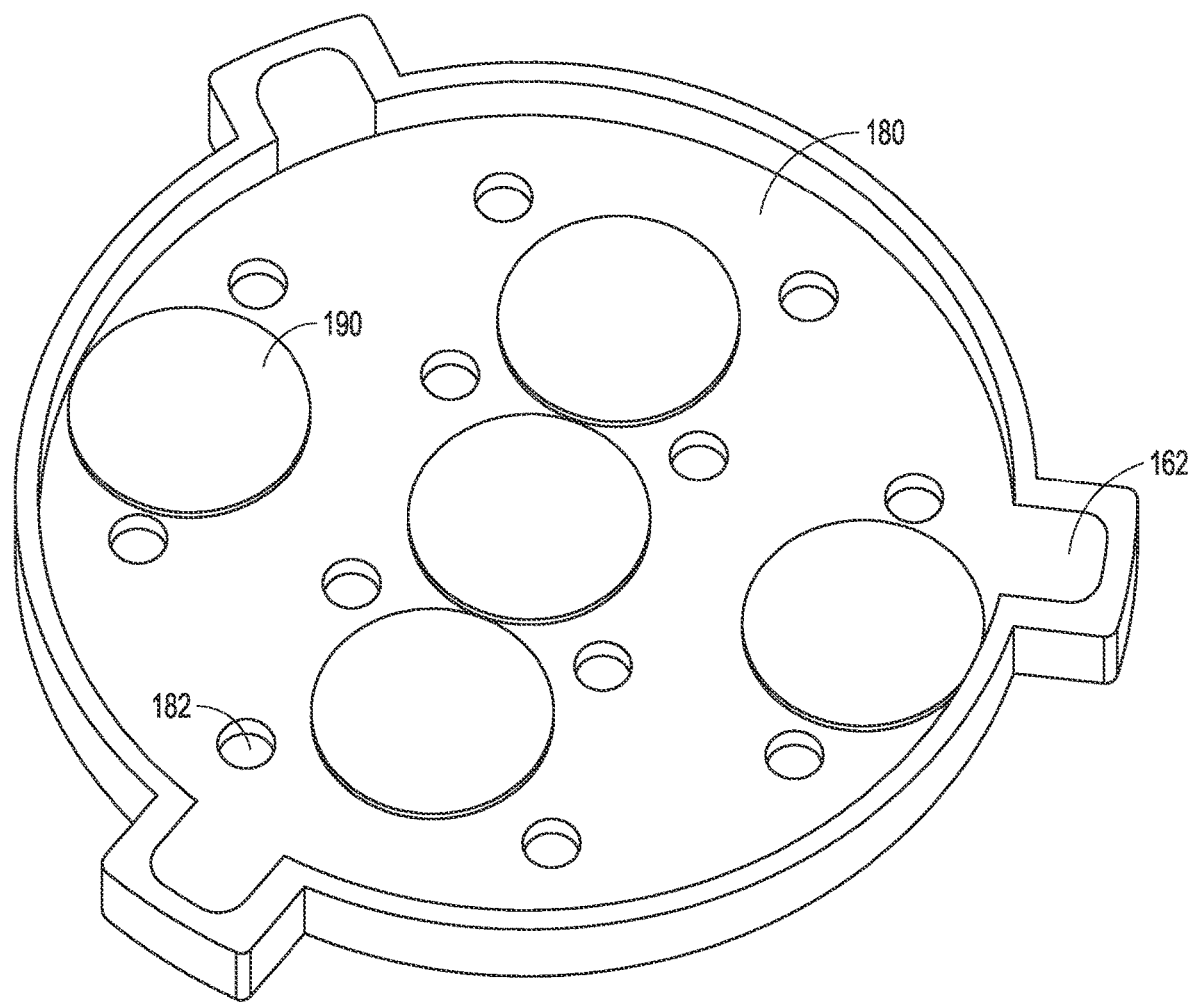
FIG. 1B is a perspective view of a bottom of the pedestal cleaning apparatus of FIG. 1A.
Figure 1C:
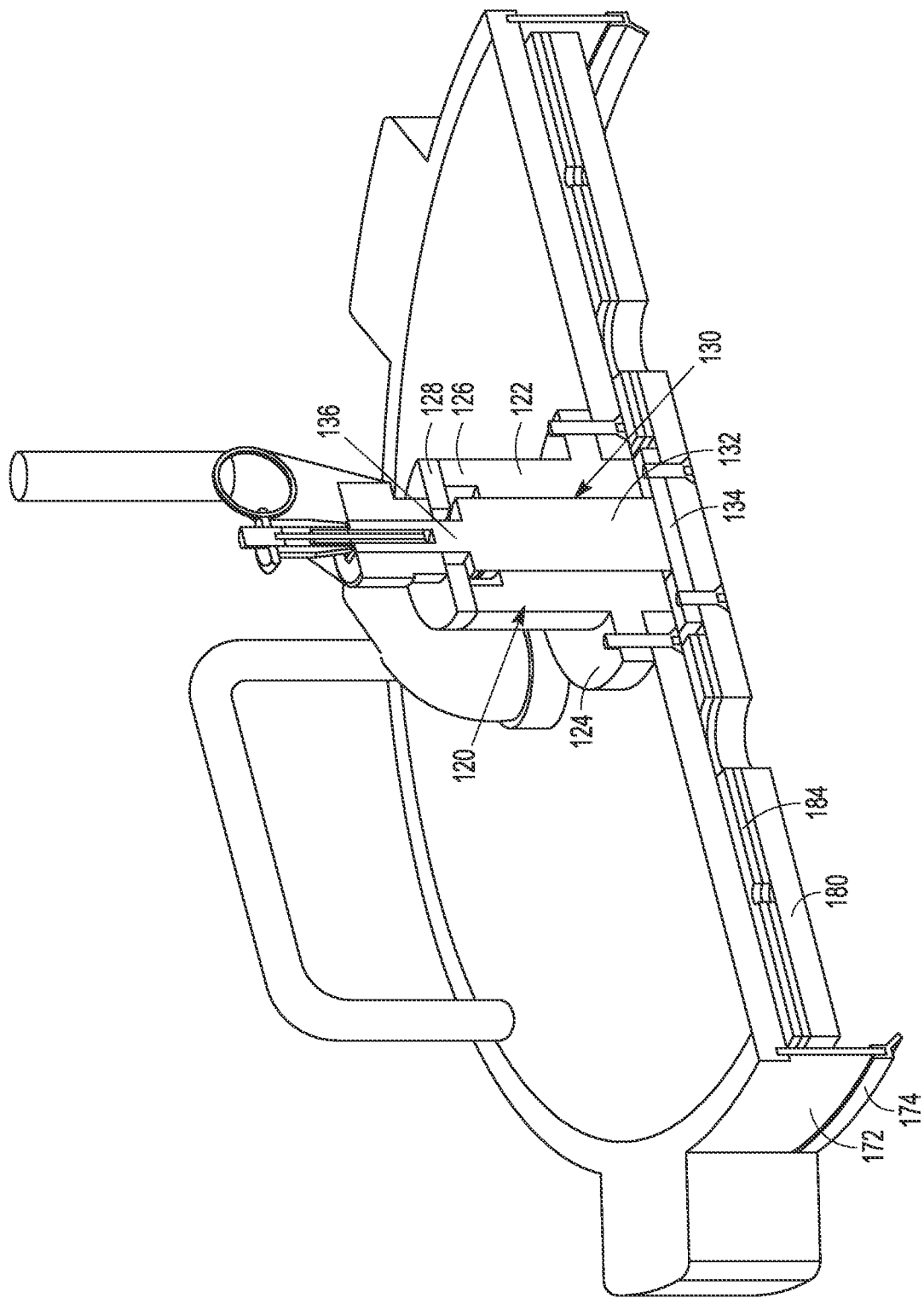
FIG. 1C is a schematic cross-sectional view of the pedestal cleaning apparatus of FIG. 1A.
Figure 1D:
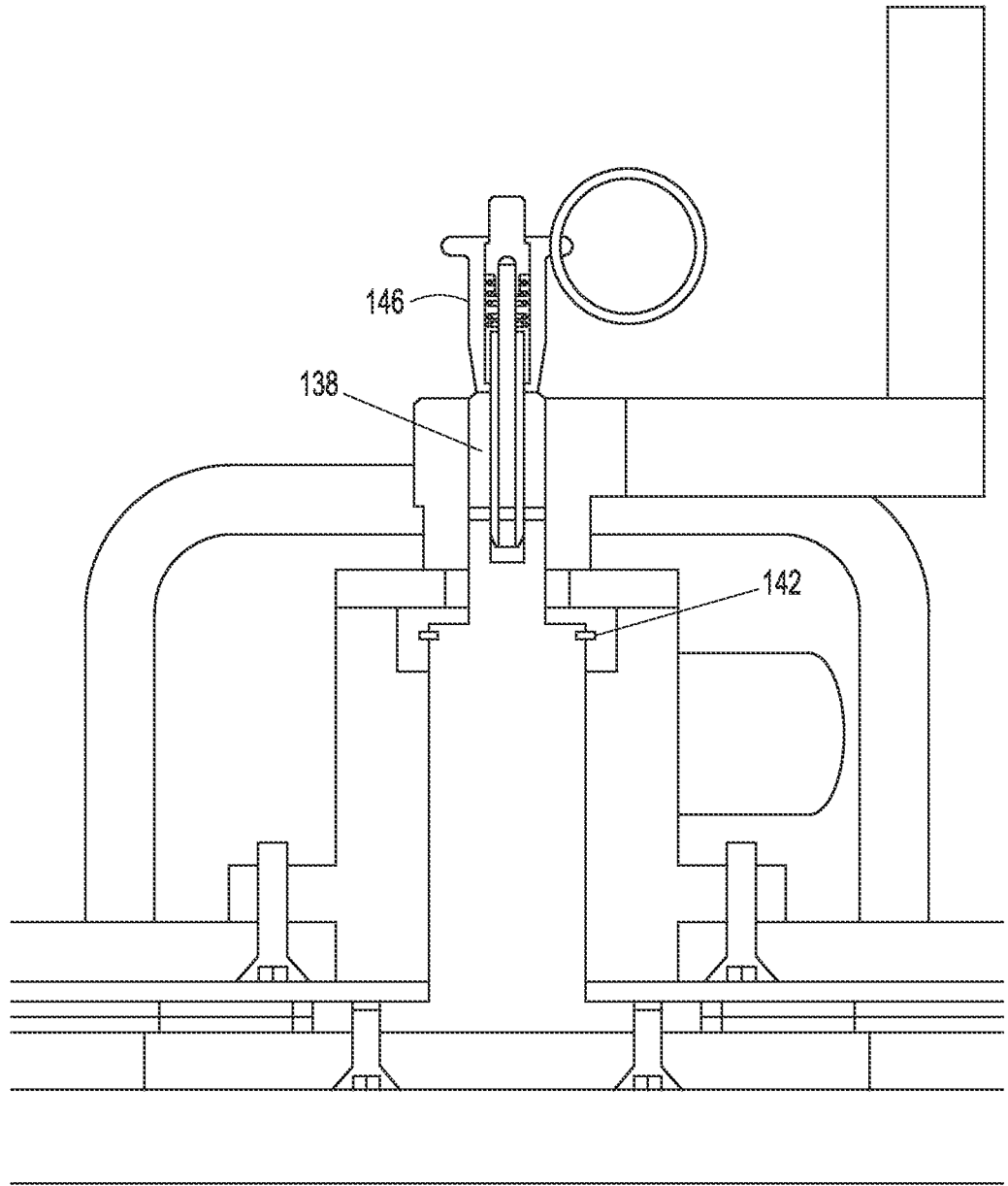
FIG. 1D is a cross-sectional view of a portion of the pedestal cleaning apparatus of FIG. 1A.

Thus, instead of eliminating polishing altogether, polishing may be performed using a polishing mechanism that reduces load variation compared with hand polishing. Reference is now made to FIGS. 1A-1D. FIG. 1A is a perspective view of a top of a pedestal cleaning apparatus, according to an example embodiment. FIG. 1B is a perspective view of a bottom of the pedestal cleaning apparatus of FIG. 1A. FIG. 1C is a schematic cross-sectional view of the pedestal cleaning apparatus of FIG. 1A. FIG. 1D is a cross-sectional view of a portion of the pedestal cleaning apparatus of FIG. 1A. Note that although some elements are shown in the figures of the various embodiments described herein, other elements may be present but are not shown for convenience. These figures thus include various views of an example cleaning apparatus 100. As used herein, the terms "upper", "lower", "top" and "bottom" refer to directions relative to the underlying pedestal surface on which the cleaning apparatus 100 is to operate. Thus, an upper section or top surface is more distal from the pedestal than a lower section or bottom surface.

As shown, the cleaning apparatus 100 includes a baseplate 110. The baseplate 110 as described herein is a structure that supports other elements used to remove the residue on the underlying pedestal. The baseplate 110 may be circular and have a diameter larger than that of the pedestal on which the cleaning apparatus 100 is disposed. The baseplate 110 may have a baseplate hole. The baseplate hole as described herein is a hole that extends through the baseplate 110 and through which one or more elements described in more detail below extend. The baseplate 110 has extensions 112 that extend from the circumference of the circle. The extensions 112 are disposed to match engaging members on the underlying pedestal through feet 160 to which the extensions 112 are attached. The underside of the feet 160, as best shown in FIG. 1B, have a recess 162 into which the engaging members of the pedestal are inserted. As shown, the extensions 112 and feet 160 are disposed at about 120° increments. The feet 160 may be formed from a plastic, such as high-density polyethylene resin (HDPE). In some embodiments, the fastening mechanisms used herein, such as to secure the extensions 112 and feet 160 together, are screws.

The baseplate 110 has stationary handles 114 attached thereto to enable a user to lift and carry the cleaning apparatus 100 from one pedestal to another or to a storage area. As shown, the stationary handles 114 are disposed at about 120° increments, although other embodiments may be used in which only two handles or at least four handles may be used. The stationary handles 114 are formed from aluminum or one or more other materials of sufficient strength to support the cleaning apparatus 100 when the cleaning apparatus 100 is moved between pedestals.

A sealing mechanism 170 extends from a bottom of the baseplate 110 to seal the baseplate 110 to the pedestal during the cleaning process and contain the dust generated thereby within the cleaning apparatus 100. The sealing mechanism 170, as best shown in FIG. 1C, contains a skirt 172 formed from HDPE or similar material and a gasket 174 attached to an end of the skirt 172. The skirt 172 is retained within a groove in the bottom surface of the baseplate 110. The diameter of the groove is larger than the diameter of the underlying pedestal, and thus of the disk 180 retaining the abrasive. The skirt 172 and the gasket 174 may be formed from a flexible material, such as polycarbonate or rubber. The skirt 172 and the gasket 174 may be formed from the same material or different materials.

The baseplate 110 has, in addition, at least one exhaust port 150 through which the dust and debris from cleaning of the pedestals is removed using exhaust holes in the baseplate 110. The exhaust ports 150 may be formed from polyvinyl chloride (PVC) or another durable plastic or metal material. When in operation, suction is applied to the exhaust ports 150 to remove the dust resulting from the cleaning operation. Note that the direction of extension, as well as the shape, of the exhaust ports 150 may be different. The height of the exhaust ports 150 is somewhat lower than a rotatable handle 140 so that the dust removal provided by the exhaust ports 150 does not interfere with the rotation of the rotatable handle 140. The rotatable handle 140 is an element that, as described herein, is a manually-actuated device to impart rotational force.

The disk 180, as shown in FIGS. 1B and 1C, may be formed from aluminum and contains multiple disk holes 182 that extend therethrough. The disk 180 is an element that, as described herein, is coupled to other elements and is rotationally movable. As the disk 180 rotates, at least one of the disk holes 182 eventually partially or completely aligns with the exhaust holes in the baseplate 110, as well as holes in one or more weights 184 disposed between the baseplate 110 and the disk 180. The disk holes 182 have a regular grid pattern, with adjacent disk holes separated by a uniform center-to-center distance. In other embodiments, other patterns may be used, as long as the AI dust is able to be extracted through the exhaust ports 150 during cleaning.

The one or more weights 184 may be stainless steel rings attached to the disk 180. The holes in the weights 184 are aligned with the disk holes 182. Although the one or more weights 184 may be rings (weighted rings) whose weight is distributed uniformly over essentially the entire surface of the disk 180, in other embodiments, the one or more weights 184 may be one or more isolated weights that are attached to, and distributed evenly around, the disk 180. The weights 184 provide increased normal load on the abrasive pads 190, so that the polishing action is accelerated. The abrasive pads 190 are elements that, as described herein, are formed from a material capable of removing unwanted processing residue on the underlying pedestal and thereby flatten the pedestal. The pedestal is an element that, as described herein, is an element configured to retain one or more semiconductor wafers for processing. In some embodiments, the weights may be eliminated, instead the weight of the entire cleaning apparatus 100 may be used to press down on the abrasive pads 190. In this case, the feet 160 may not seat on the pedestal's ears, which are instead only used to prevent rotation of the cleaning apparatus 100 when the handle 140 is turned. The entire cleaning apparatus 100 here may sit directly on the pedestal surface.

The separation of the disk 180 from the baseplate 110 is provided by the float in the central shaft caused by the sizing of the various elements and associated tolerances. That is, even after assembling the weights 184, there is a gap between the baseplate 110 and the rings 184, so that the floating action of the handle 140 is retained. In some embodiments, each ring 184 is narrow enough that it does not occlude the vacuum suction holes 182 on the disk 180. Alternatively, each ring 184 may be large for better and increased weight distribution, but also have a plurality of holes such that the vacuum function is not impeded.

Abrasive pads 190 are pasted or otherwise attached to the disk 180. As the diameter of the pedestal is larger than that of each abrasive pad 190, multiple abrasive pads 190 are attached to the disk 180 at predefined marked locations. The abrasive pads 190 may be, for example, formed from sandpaper. In particular, the abrasive pads 190 are attached to the disk 180 at locations that do not overlap any of the disk holes 182. As shown in FIG. 1B, five abrasive pads 190 are aligned in perpendicular directions. Specifically, one of the abrasive pads 190 is disposed in the center of the disk 180 such that the center of the abrasive pad 190 is aligned with the center of the disk 180. Two of the remaining abrasive pads 190 are tangential to the center abrasive pad 190 (separated by a fraction of an inch) in a first direction such that the centers of the tangential abrasive pads 190 are aligned in the first direction. The other two of the remaining abrasive pads 190 are separated from the center abrasive pad 190 in a second direction, perpendicular to the first direction, such that the centers of the separated abrasive pads 190 are aligned in the second direction. The separation between the separated abrasive pads 190 is less than the diameter of the abrasive pads 190. The abrasive pads 190 are thus disposed such that the entirety of the pedestal surface is covered at least once in a single rotation of the disk 180. Note that although five abrasive pads 190 are shown in FIG. 1B, in other embodiments, a different number of abrasive pads of the same size may be used (e.g., three or seven) if disposed such that the entire surface of the pedestal is cleaned. The abrasive pads 190 may be formed from silicone to allow for even sanding of the underlying pedestal surface.

The disk 180, and thus abrasive pads 190, is rotated using a manipulating handle of a rotatable handle 140 that is coupled with the disk 180 through a coupling mechanism attached to a shaft 130 disposed within a collar 120 that is coupled to the baseplate 110. The collar 120 as described herein is an element coupled to the baseplate 110 and configured to receive manipulating elements therein, as described in more detail below. In particular, the collar 120 has a collar hole that extends therethrough and, as described, is configured to receive the manipulating elements therein, as described in more detail below. The manipulating handle is the portion of the rotatable handle 140 that is manipulated by the operator. Relative rotational movement of the rotatable handle 140 thus rotates the abrasive pads 190, grinding down the deposits on the pedestal. The collar 120 is terminated by a cap 128. That is, the cap 128 as described herein is an element configured to terminate the collar 120. The cap 128 is configured to impede the vertical (downward) movement of the rotatable handle 140. The cap 128 thus impedes force provided by the rotatable handle 140 in the vertical direction. The cap 128 has a cap hole that, as described herein, is an element that extends through the cap 128 and is configured receive other elements disposed therein.

The shaft 130, as described herein, is an element that extends through multiple holes and is configured to impart rotational motion. The shaft 130 is disposed through the baseplate hole in the baseplate 110, the collar hole in the collar 120 and the cap hole in the cap 128. In some embodiments, to reduce the length of the shaft 130, a center of the baseplate hole, a center of the cap hole and a center of the collar hole are collinear. In other embodiments, the shaft 130 may be other than a straight bar, and thus one or more of the centers may not be collinear with one or more of the other centers. The collar 120 has a center collar portion 122, a lower collar portion 124 attached to the baseplate 110, and an upper collar portion 126 to which the cap 128 is attached, through all of which the shaft 130 extends. In addition to being attached to the baseplate 110, the lower collar portion 124 also extends through the baseplate hole. The cap 128 and the collar 120 may be formed from a polymer material, such as Delrin.

The shaft 130 may be formed from stainless steel, for example, and has a center shaft portion 132, a lower shaft portion 134 attached to the disk 180, and an upper shaft portion 136 to which the rotatable handle 140 is attached. The center shaft portion 132 and lower shaft portion 134 are circular, with a diameter of the center shaft portion 132 being smaller than that of the lower shaft portion 134. The lower shaft portion 134 is attached to the top of the disk 180. The upper shaft portion 136 extends through the cap hole in the cap 128 to couple with the rotatable handle 140. In some embodiments, the upper shaft portion 136 has a square shape, with the rotatable handle 140 having a matching handle hole into which the upper shaft portion 136 extends. The diameter of the square upper shaft portion 136 is smaller than that of the circular center shaft portion 132.

Rather than a square shape, other multi-sided shapes (such as rectangular or triangular) may, of course, be used for the upper shaft portion 136 and handle hole. The use of a non-circular shape for the upper shaft portion 136 permits the rotatable handle 140 to be used without fastening the handle to the upper shaft portion 136, allowing the handle 140 to be freely removed from the upper shaft portion 136. To retain the rotatable handle 140 in place during storage or transport, as shown in FIG. 1D, a retaining mechanism, such as a ball-lock pin 146 may be inserted into a top hole in a top shaft portion 138 of the upper shaft portion 136. Note that in some embodiments, the retaining mechanism may be a screw. In this embodiment, the shaft has a shaft portion with a shaft portion hole therein, which is threaded. A screw is disposed in the shaft portion hole to retain the coupling mechanism and a rotatable handle 140.

A collar hole through the collar 120 has an essentially uniform diameter (within mechanical tolerance) within the center collar portion 122 and the lower collar portion 124, expanding to a larger diameter in the upper collar portion 126. The center shaft portion 132 passes entirely through the hole in the center collar portion 122 and into the hole in the upper collar portion 126. A circular limiter 142 is disposed around the center shaft portion 132 at an upper end of the center shaft portion 132. The circular limiter 142 may be, for example, disposed within a groove formed in the upper end of the center shaft portion 132 and act as a stop for downward motion of the shaft 130. The use of the different diameters provided by the center collar portion 122 and the lower collar portion 124, along with the circular limiter 142 and the weights 184, may provide a vertical float to the disk 180 to ensure that the abrasive pads 190 always contact the pedestal surface.

Note that although shown as separate entities, one or more of the cap 128, collar 120 and baseplate 110 may be integral in other embodiments. Such an integral component may have collar, cap and baseplate sections of similar dimensions and functions of their separate counterparts. Other embodiments may contain similarly integrated components (such as one or more of the cap, bushing, and baseplate shown in FIGS. 3A-3C being integrated).

Figure 2A:
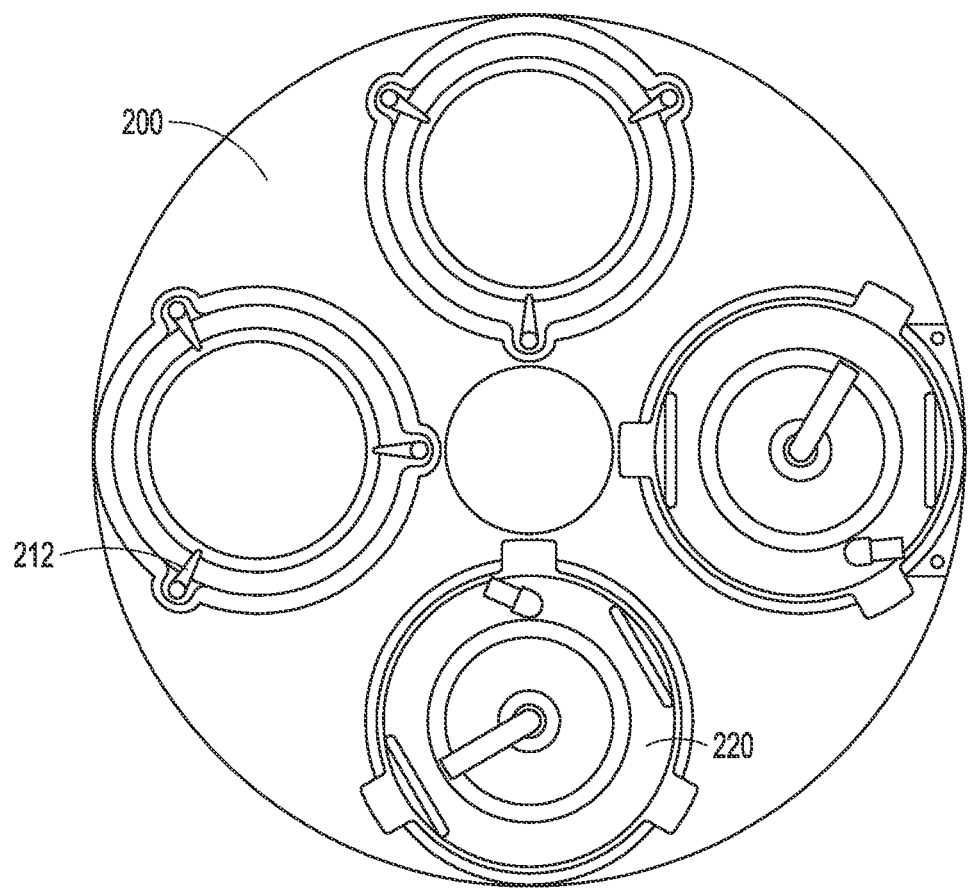
FIG. 2A is a top view of a chamber in which the pedestal cleaning apparatus is used, according to an example embodiment.
Figure 2B:
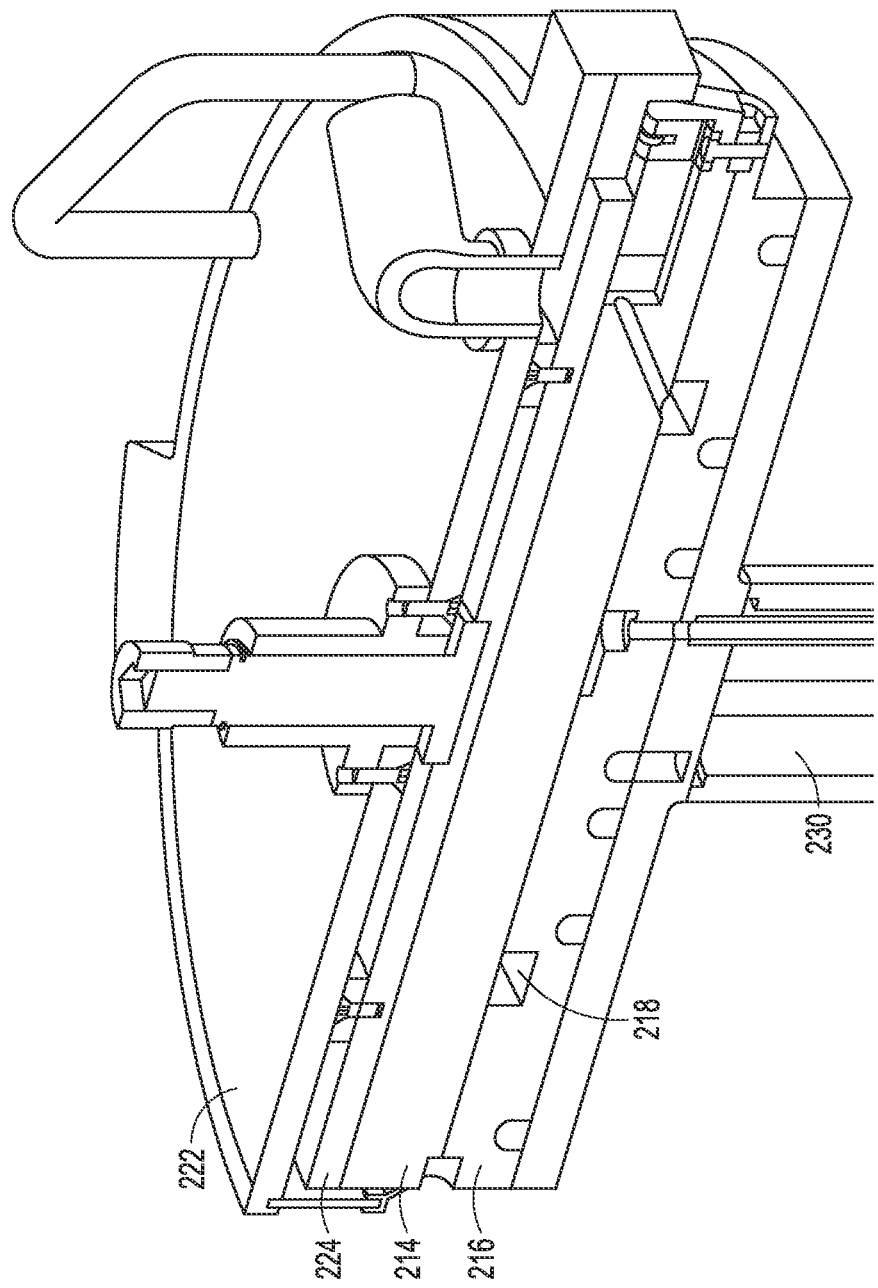
FIG. 2B is a perspective cross-sectional view of the chamber of FIG. 2A.

FIGS. 2A-2C are views of a chamber in which a pedestal cleaning apparatus is used, according to an example embodiment. In particular, FIG. 2A is a top view of the chamber, FIG. 2B is a perspective cross-sectional view of the chamber of FIG. 2A, and FIG. 2C is a schematic cross-sectional view of the chamber of FIG. 2A.

The chamber 200 may be any chamber in which semiconductor processing occurs and may be ISO 1-8. The chamber 200 may have one or more fixed vacuum pedestals 210 disposed uniformly therein, on each of which a different cleaning apparatus 220 may be disposed. As shown, each pedestal 210 has an engagement mechanism 212 with which the feet of the cleaning apparatus 220 engages securely. The engagement mechanism 212 contains individual engagement members set at about 120° around the pedestal 210 and on which each foot 226 of the cleaning apparatus 220 is disposed. The cleaning apparatus 220, among other elements, contains a baseplate 222, a rotating disk 224, feet 226 and sealing mechanism 228, similar to those described above. The implementation shown in FIGS. 2B and 2C are described in more detail in relation to FIGS. 6A-6D, and thus will not be described in detail here.

The pedestal 210 contains a pedestal top 214 in which the engagement mechanism 212 is retained. The pedestal top 214 is disposed on a pedestal base 216 that contains one or more grooves 218. The grooves 218 are connected to a pedestal stand 230 through which a vacuum is supplied to the grooves 218 to retain semiconductor wafers on the pedestal 210.

Figure 7:
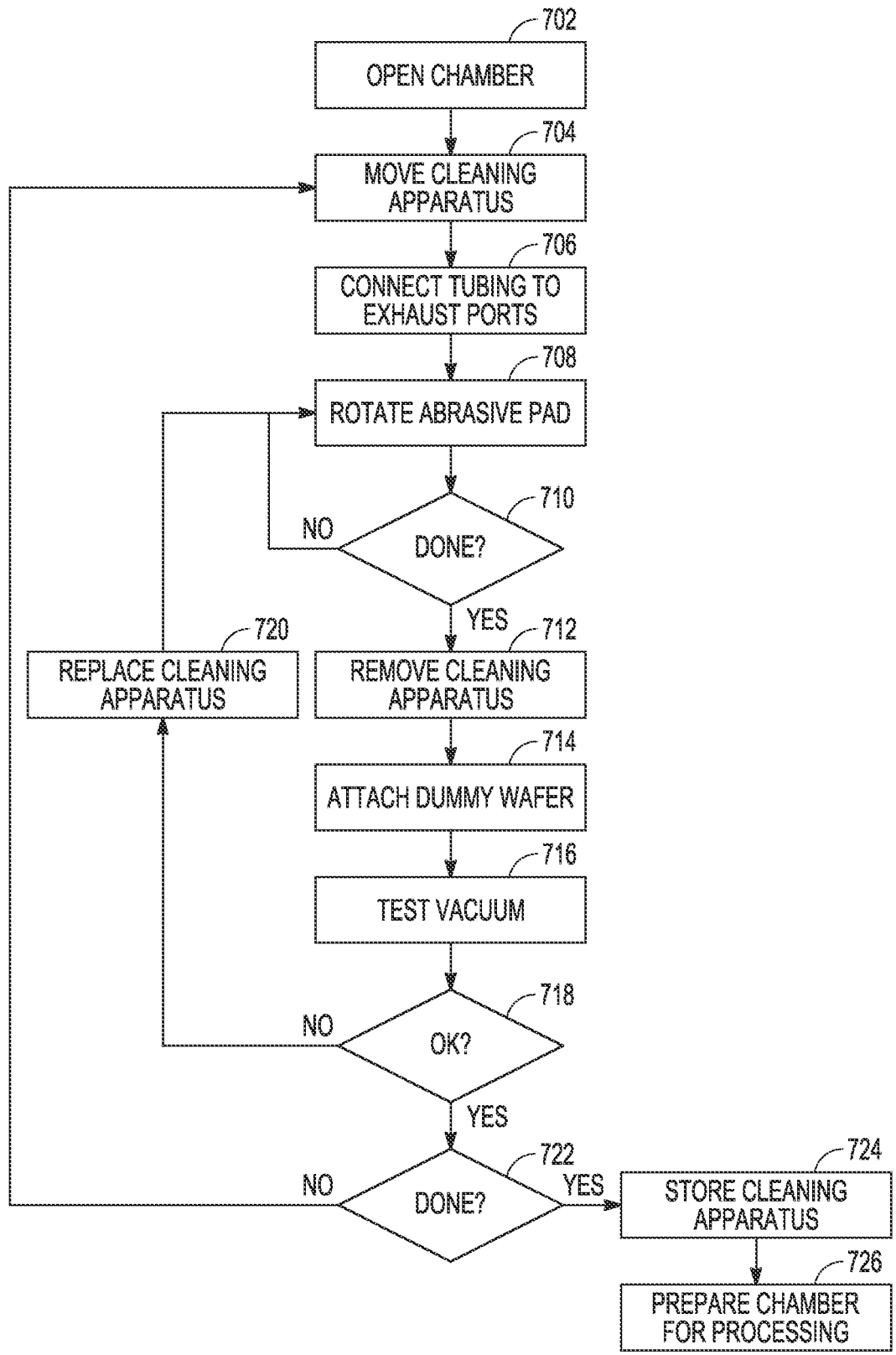
FIG. 7 is a flow chart showing operations in a method, according to an example embodiment.

A method of cleaning the chamber 200 is shown in FIG. 7. When the cleaning cycle begins, the chamber 200 is opened at operation 702. This occurs, of course, after all of the semiconductor wafers are safely stored. After the chamber 200 is opened, the cleaning apparatus 220 may be manually carried from a storage area using the stationary handles on the cleaning apparatus 220 and placed on one of the pedestals 210 to be cleaned, at operation 704. The rotatable handle of the cleaning apparatus 220, if present, is maintained in place using the ball-lock pin.

In particular, the cleaning apparatus 220 is aligned on the pedestal 210 such that the feet 226 of the cleaning apparatus 220 are aligned with the engagement mechanisms 212 of the pedestal 210. After cleaning the pedestal 210 with isopropyl alcohol, the cleaning apparatus 220 is then lowered onto the pedestal 210 and a seal is secured by the sealing mechanism 228 as the cleaning apparatus 220 is seated on the pedestal 210.

After moving the cleaning apparatus 220 to the pedestal 210, tubing is connected to the exhaust ports at operation 706. The tubing is used to provide suction to the cleaning area of the cleaning apparatus 220. The tubing is connected and run such that the dust removal (exhaust port and tubing) does not inhibit rotation of the rotatable handle.

Once the cleaning apparatus 220 is securely disposed on the pedestal 210 and the tubing connected, the abrasive pads of the cleaning apparatus 220 are rotated in a particular direction (e.g., clockwise) a predetermined number of times or for a predetermined amount of time at operation 708. In the embodiment above, the abrasive pads are rotated by manually rotating the rotatable handle of the cleaning apparatus 220. Because the vertical force is almost entirely supplied by the cleaning apparatus 220, whether additional weighting is supplied by weights between the baseplate 222 and the disk 224, the variation in the vertical force (and thus the amount of removal per rotation) is minimized as well as minimizing tilting of the cleaning apparatus 220 when force is applied to the rotatable handle, if present. This permits a good approximation to the amount of time to remove a predetermined amount of AlF deposit from the surface of the pedestal 210. In other embodiments, as described in more detail below, a single abrasive pad may be used and/or the rotation may be provided by a motor, rather than a manually actuated rotatable handle.

After determining at operation 710 that the predetermined amount of time/number of revolutions has not yet been reached, the cleaning apparatus 220 is continues to clean the pedestal 210, returning to operation 708. After determining at operation 710 that the predetermined amount of time/number of revolutions is reached, the cleaning apparatus 220 is removed from the pedestal 210 at operation 712. This includes detaching the tubing and manually removing any remaining debris from the surface of the pedestal 210, such as using a handheld vacuum. The cleaning apparatus 220 may be moved to another pedestal or work area, or stored at this point.

The pedestal 210 is then vacuum tested to ensure that the clamping pressure provided by the cleaned pedestal 210 is adequate for the desired performance. In some embodiments, this may include placing a dummy wafer of the same size as a semiconductor wafer on the pedestal 210 at operation 714 and testing the pressure on the dummy wafer that is supplied by the vacuum to make sure that a pressure sufficient to retain the wafer in place during actual processing (e.g., <3 torr or <10 torr pressure) is maintained at operation 716.

If adequate pressure is determined at operation 718 not to be maintained, the cleaning apparatus 220 is returned to the same pedestal 210 at operation 720 for another round of cleaning at operation 708. When the cleaning is repeated, the same number of rotations/time may be used or the number may be reduced (e.g., halved) due to the amount of material already removed from the pedestal 210.

If adequate pressure is determined at operation 718 to be maintained, it is determined at operation 722 whether additional pedestals are to be cleaned by the cleaning apparatus 220. If additional pedestals are to be cleaned by the cleaning apparatus 220, the cleaning apparatus 220 is then moved at operation 704 to a new pedestal. If no further pedestals are to be cleaned by the cleaning apparatus 220, the cleaning apparatus 220 is then stored at operation 724. After storing the cleaning apparatus 220, the chamber 200 may be prepared for semiconductor processing at operation 726. Alternatively, additional cleaning of the pedestals or other processing stations may be undertaken while the chamber 200 is in the maintenance (cleaning) cycle.

Figure 3A:
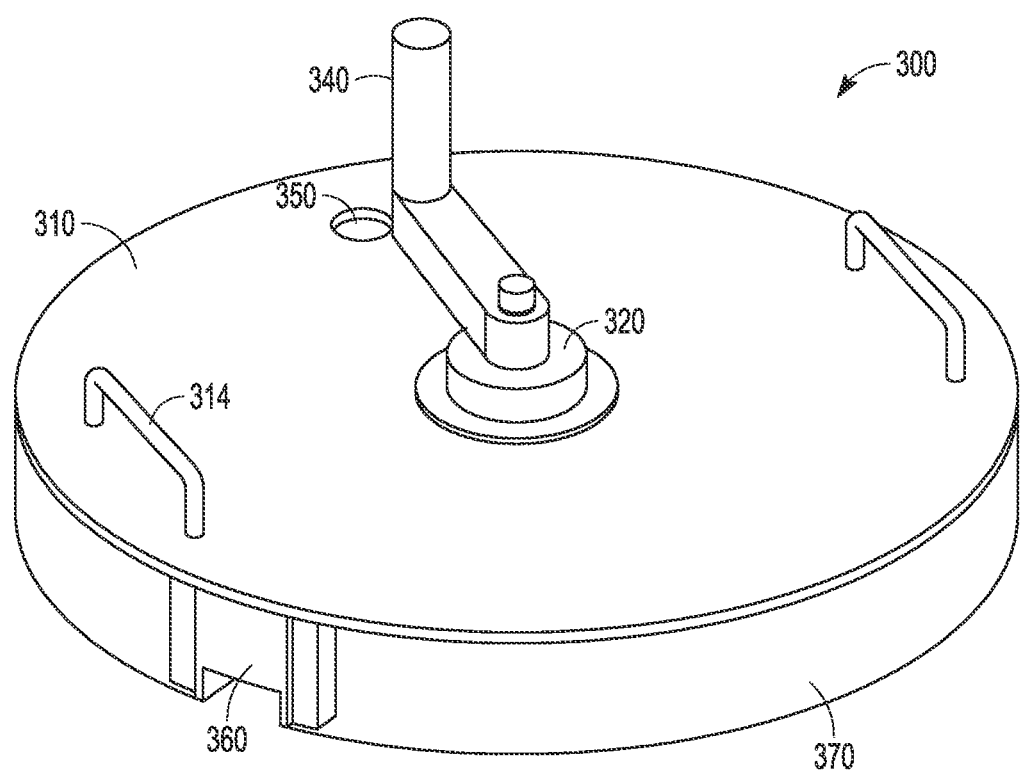
FIG. 3A is a perspective view of a top of a pedestal cleaning apparatus, according to another example embodiment.
Figure 3B:
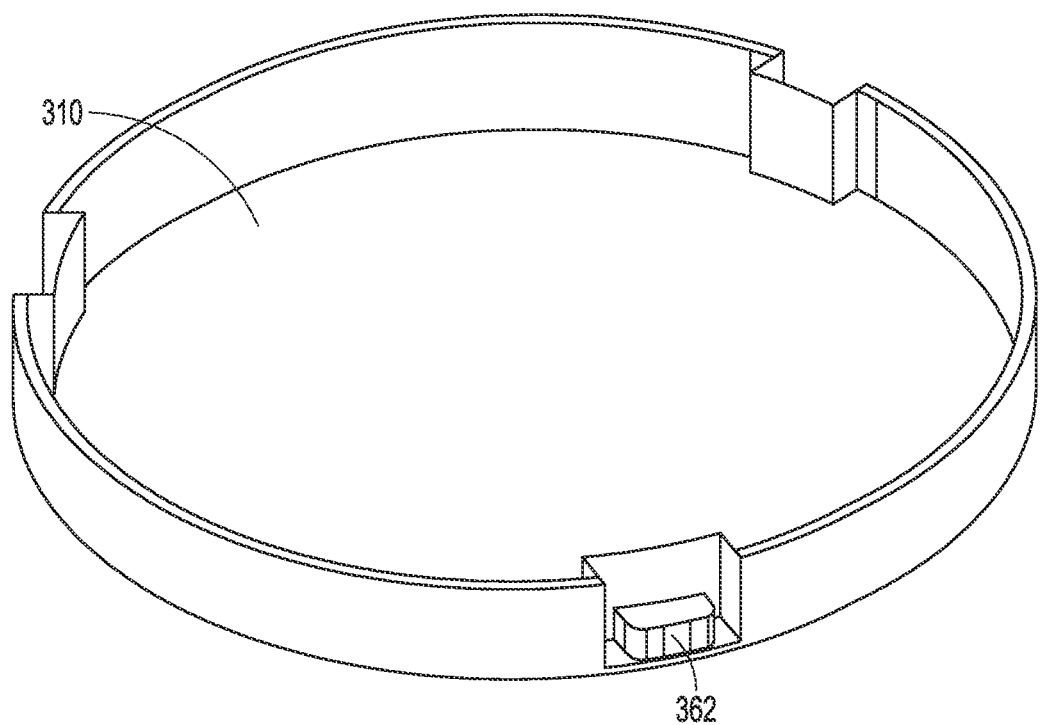
FIG. 3B is a perspective view of a bottom of the pedestal cleaning apparatus of FIG. 3A.
Figure 3C:
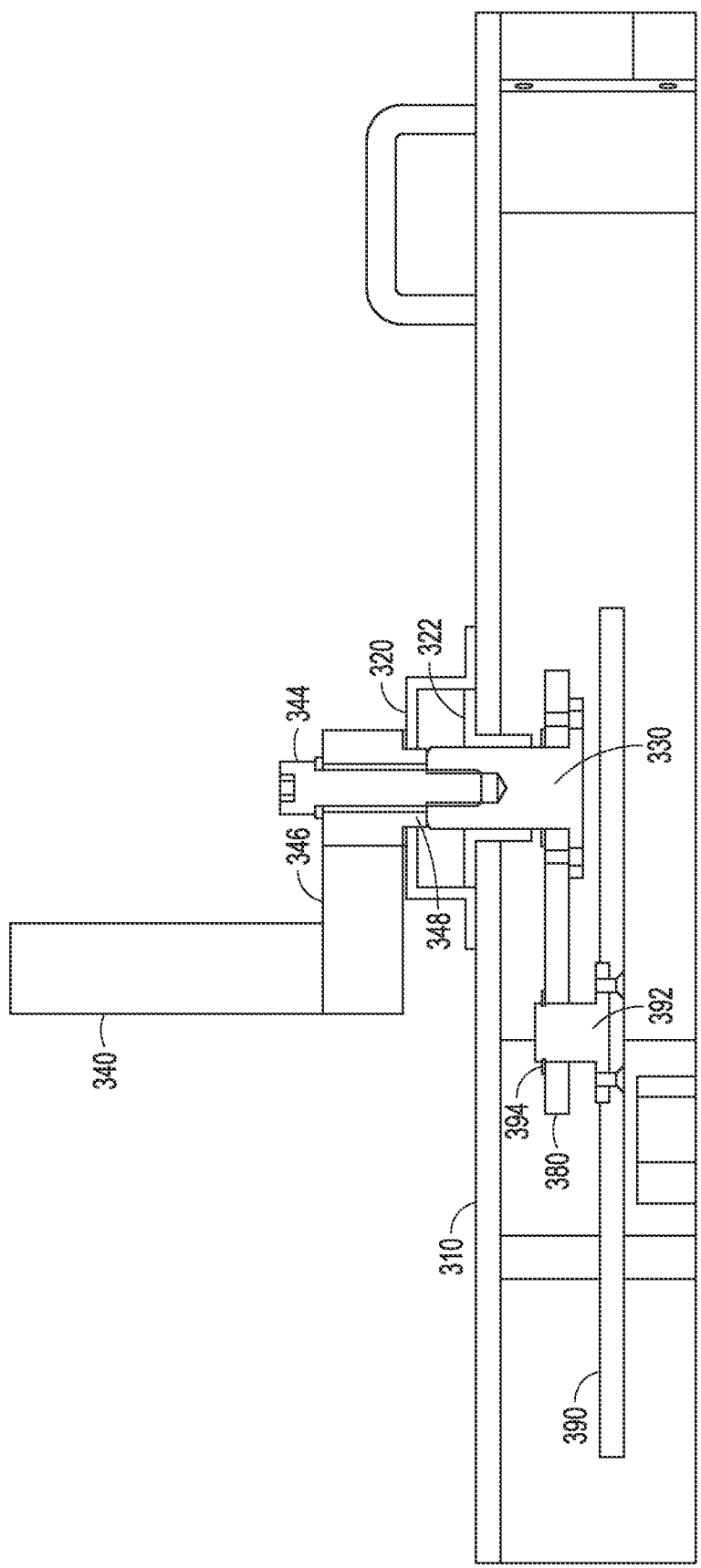
FIG. 3C is a schematic cross-sectional view of the pedestal cleaning apparatus of FIG. 3A.
Figure 3D:
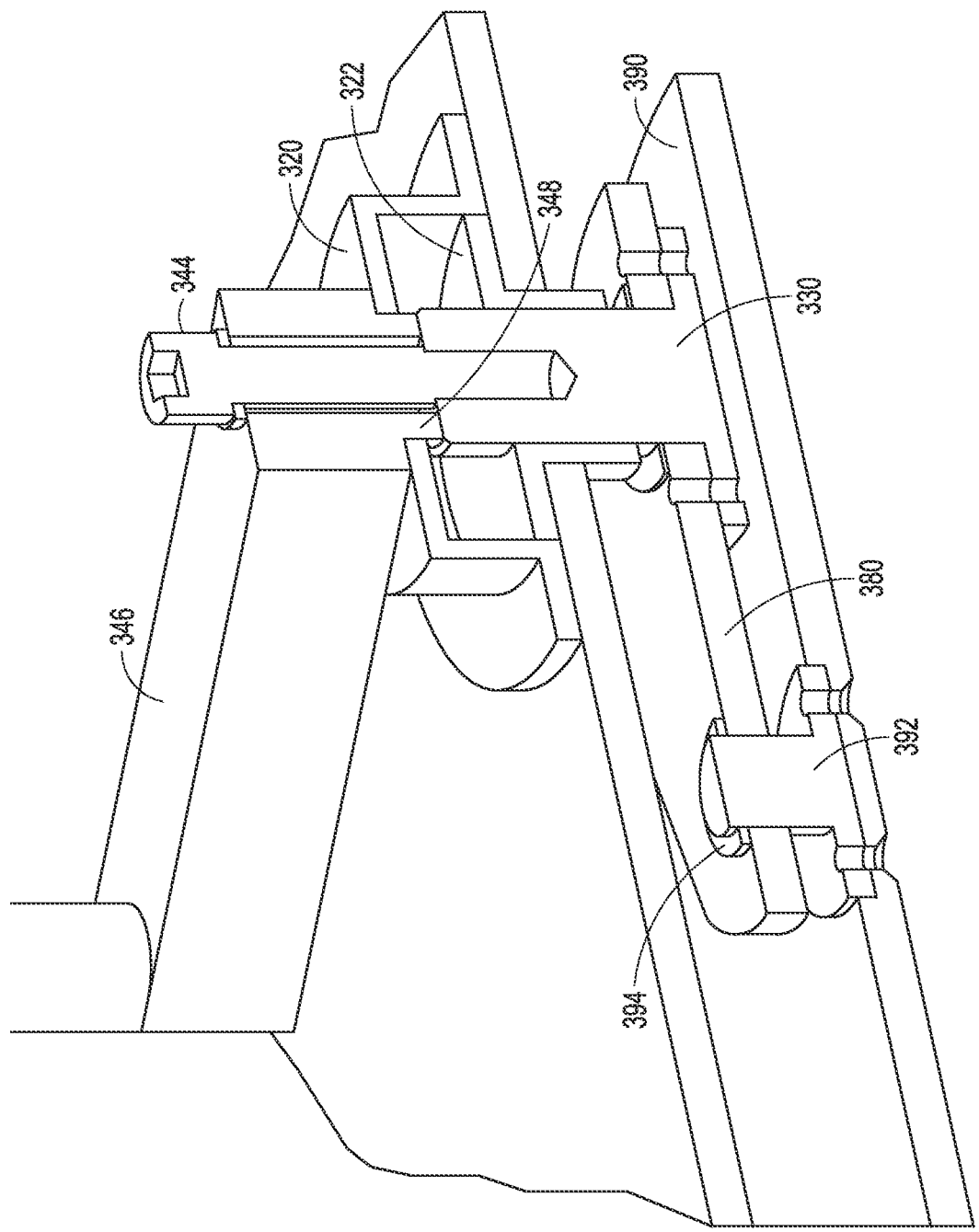
FIG. 3D is a perspective cross-sectional view of the pedestal cleaning apparatus of FIG. 3A.

FIGS. 3A-3D illustrate another pedestal cleaning apparatus embodiment. In particular. FIG. 3A is a perspective view of another example embodiment of a top of a pedestal cleaning apparatus; FIG. 3B is a perspective view of a bottom of the pedestal cleaning apparatus of FIG. 3A; FIG. 3C is a schematic cross-sectional view of the pedestal cleaning apparatus of FIG. 3A. FIG. 3D is a perspective cross-sectional view of the pedestal cleaning apparatus of FIG. 3A.

The embodiment shown in FIGS. 3A-3D contains many of the elements shown in the embodiment previously described. The cleaning apparatus 300 includes a baseplate 310. The baseplate 310 may be circular and have a diameter larger than that of the pedestal on which the cleaning apparatus 300 is disposed. The baseplate 310 has at least one exhaust hole 350 through which the dust from cleaning of the pedestals is removed using an exhaust port.

The baseplate 310 has a pair of stationary handles 314 attached thereto for porting the cleaning apparatus 300 between pedestals or a storage area. The baseplate 310 has feet 360 attached to the underside of the baseplate 310. The feet 360, as shown in FIG. 3B, each have a recess 362 into which an engaging member of the pedestal is inserted. A sealing mechanism 370 (FIG. 3A) extends from a groove in the bottom of the baseplate 310 to seal the baseplate 310 to the pedestal during the cleaning process and contain the dust generated thereby within the cleaning apparatus 300. The sealing mechanism 370 may include the same elements as before (skirt/gasket) formed of the same materials. Unlike the embodiment of FIGS. 1A-1D, the sealing mechanism 370 does not extend around the entire circumference of the baseplate 310. Instead, as shown, the sealing mechanism 370 is formed in sections and the sections are attached to the feet 360. The feet 360 may be formed from Delrin or a similar polymer.

Also, unlike the embodiment of FIGS. 1A-1D, the cleaning apparatus 300 does not contain a disk. Instead, a revolving handle 340 is connected to the abrasive pad 390 through an aluminum (or other similar material) crank plate 380, as shown in FIGS. 3B-3D. In more detail, the revolving handle 340 is connected to the abrasive pad 390 through an aluminum (or other similar material) spindle 330, which connects the revolving handle 340 to the crank plate 380, and a disk collar 392, which connects the crank plate 380 and the abrasive pad 390. The disk collar 392 may be formed from Delrin or a similar polymer. The crank plate 380 may be formed from aluminum and has a substantially ovular shape (somewhat egg-shaped). Specifically, the narrower portion of the oval of the crank plate 380 is proximate to the disk collar 392 with the wider portion proximate to the spindle 330. The abrasive pad 390 is attached to the disk collar 392 using fasteners. The disk collar 392 is retained in the crank plate 380 by a circular retainer 394 that circumscribes, and is partially disposed in a groove formed in, the disk collar 392, thereby stopping the crank plate 380 from separating from the disk collar 392.

The spindle 330 is attached to the crank plate 380 using fasteners. The spindle 330 is contained in a bushing 322 retained in a circular baseplate hole in the baseplate 310. The bushing 322 may be formed from Delrin, or a similar polymer. The lower portion of the bushing 322 is separated from the crank plate 380. In some embodiments, a washer may be disposed on the crank plate 380 around the spindle 330, between the lower portion of the bushing 322 and the crank plate 380.

The revolving handle 340 is attached to the spindle 330 using a fastener 344 that couples the lower portion of the revolving handle 340 to the upper portion of the spindle 330. As shown in FIGS. 3C and 3D, a cap 320 covers the baseplate hole and the bushing 322. The spindle 330 extends upward from the crank plate 380 through the bushing 322 into a circular cavity formed by the cap 320. The lever arm 346 of the revolving handle 340 contains a circular projection 348 that extends through a circular cap hole in the cap 320 to abut the spindle 330. The cap 320 is formed from a material sufficiently strong to resist vertical force applied to the handle 304, such as aluminum. Vertical force supplied to the revolving handle 340 is thus transferred to the baseplate 310 via the cap 320.

In addition, unlike the embodiment shown in FIGS. 1A-1D, in the embodiment shown in FIGS. 3A-3D, a single abrasive pad 390 is used to clean the pedestal. Thus, when the revolving handle 340 is turned, the spindle 330 turns, turning the crank plate 380, which moves the abrasive pad 390. The abrasive pads 190 in the embodiment shown in FIGS. 1A-1D have a standard diameter (for commercial abrasive pads) that is significantly smaller than that of the baseplate 110 (about one quarter of that of the baseplate), while the abrasive pad 390 shown in FIG. 3B is at least about one half that of the baseplate 310 (at least about one half of the diameter of the underlying pedestal). This allows the abrasive pad 390 to clean the entire surface of the underlying pedestal in a single revolution. However, while fewer abrasive pads may be used in this embodiment, such a specialized diameter commercial abrasive pad may result in increased cost and difficulty of procurement.

Figure 4A:
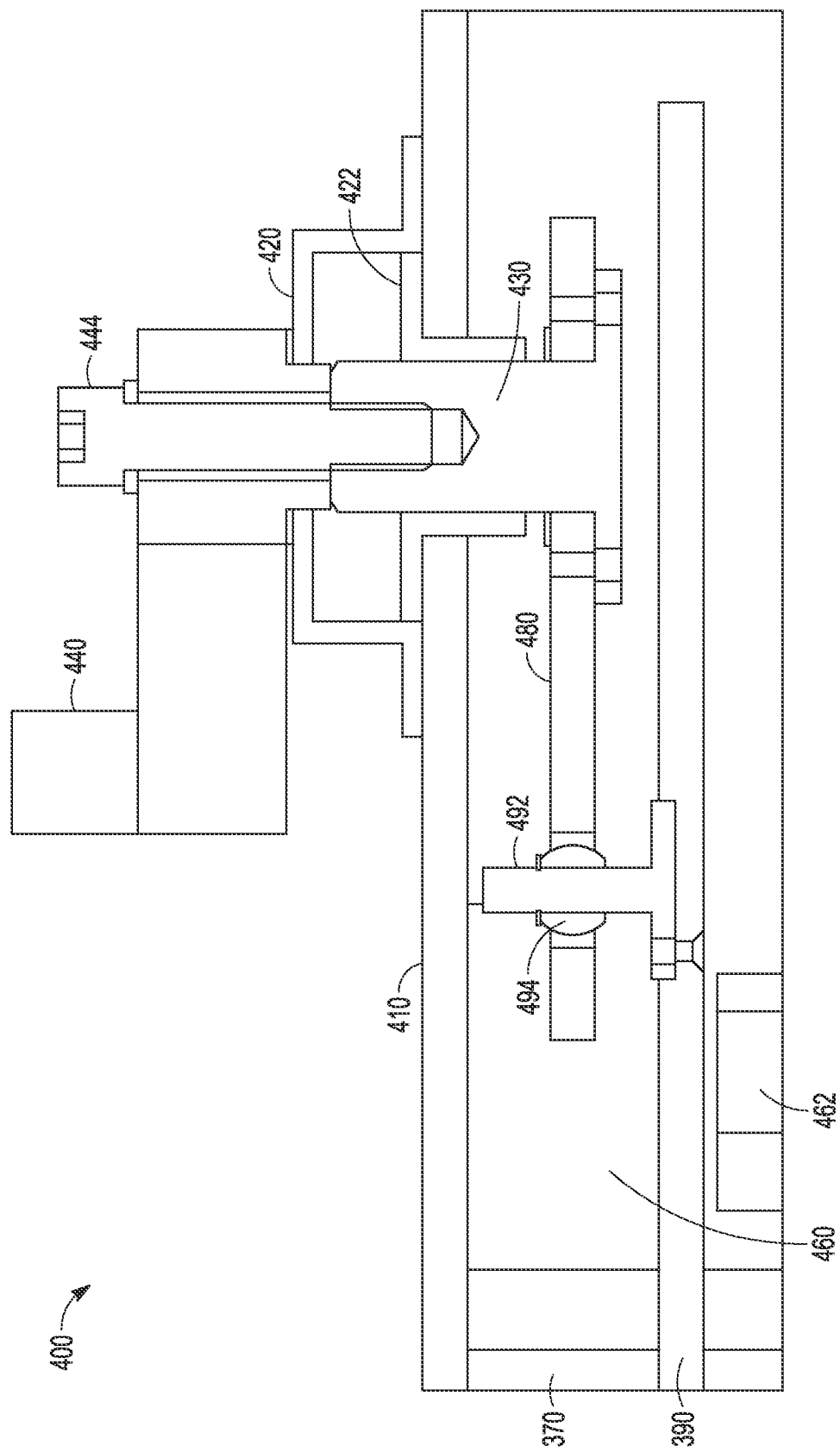
FIG. 4A is a schematic cross-sectional view of a portion of a top of a pedestal cleaning apparatus, according to another example embodiment.
Figure 4B:
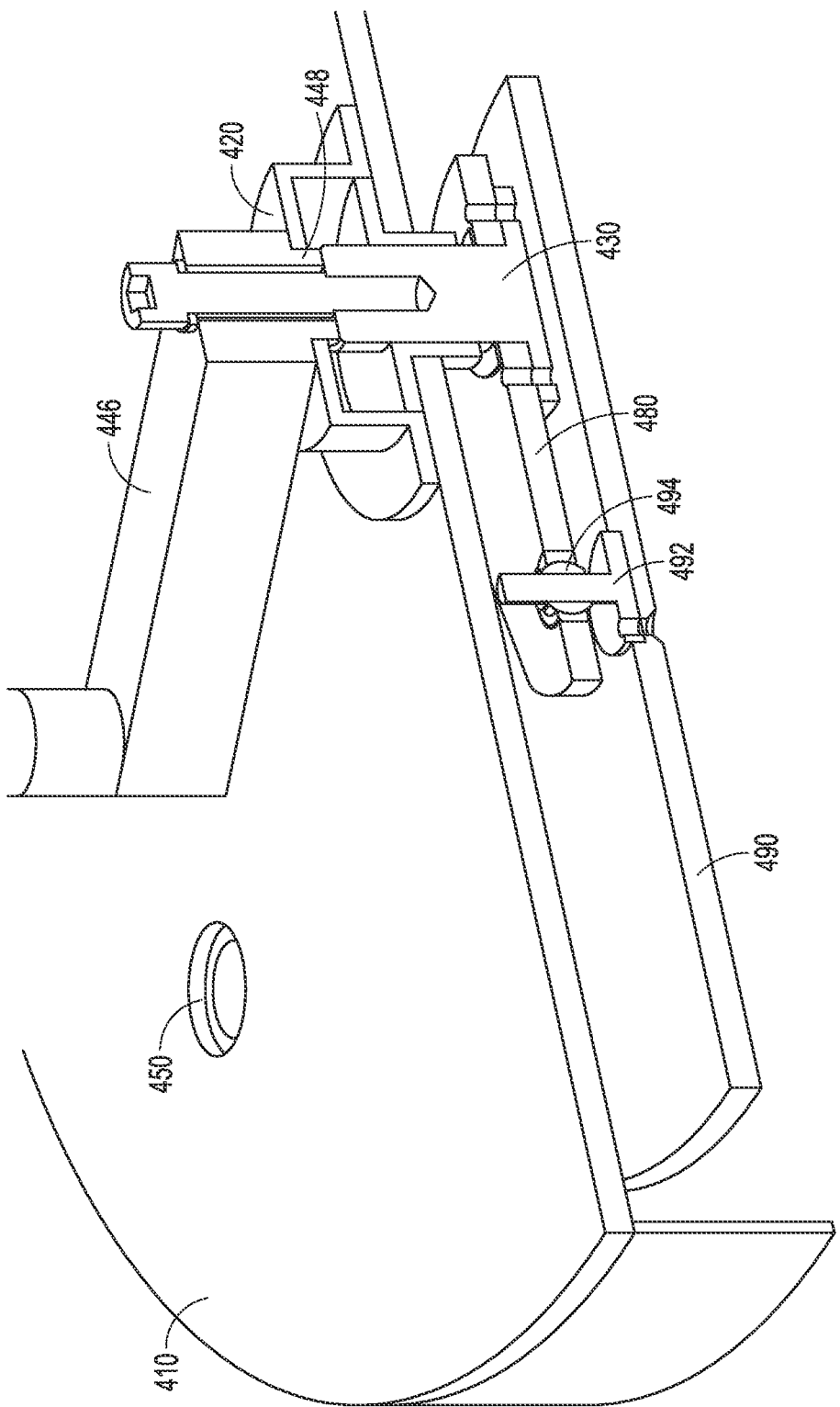
FIG. 4B is a perspective cross-sectional view of the pedestal cleaning apparatus of FIG. 4A.

FIG. 4A is a schematic cross-sectional view of a portion of a top of a pedestal cleaning apparatus, according to another example embodiment. FIG. 4B is a perspective cross-sectional view of the pedestal cleaning apparatus of FIG. 4A. The embodiment shown in FIGS. 4A and 4B is similar to that shown in FIGS. 3A-3D. Accordingly, although the top and bottom views of the embodiment in FIGS. 4A and 4B are not shown, the same elements are present as shown in FIGS. 3A and 3B.

The cleaning apparatus 400 includes a baseplate 410 with a diameter larger than that of the pedestal on which the cleaning apparatus 400 is disposed. The baseplate 410 has at least one exhaust hole 450, as shown in FIG. 4B, through which the dust from cleaning of the pedestals is removed using an exhaust port; as well as a pair of stationary handles attached thereto for porting the cleaning apparatus 400 between pedestals or a storage area.

The baseplate 410 has feet 460 attached to the underside of the baseplate 410. The feet 460, as shown in FIG. 4A, each have a recess 462 into which an engaging member of the pedestal is inserted. A sealing mechanism 470 extends from a groove in the bottom of the baseplate 410 to seal the baseplate 410 to the pedestal during the cleaning process and contain the dust generated thereby within the cleaning apparatus 400. The sealing mechanism 470 may include the same elements as before (skirt/gasket) formed of the same materials. As in the embodiment of FIGS. 3A-3D, the sealing mechanism 470 does not extend around the entire circumference of the baseplate 410. Instead, as shown, the sealing mechanism 470 is formed in sections and the sections are attached to the feet 460. The feet 460 may be formed from Delrin, or a similar polymer.

Also like the embodiment of FIGS. 3A-3D, the revolving handle 440 is connected to the abrasive pad 490 through an aluminum (or other similar material) crank plate 480. In more detail, the revolving handle 440 is connected to the abrasive pad 490 through an aluminum (or other similar material) spindle 430, which connects the revolving handle 440 to the crank plate 480, and a disk collar 492, which connects the crank plate 480 and the abrasive pad 490. The disk collar 492 may be formed from Delrin or a similar polymer. The crank plate 480 may be formed from aluminum and has a substantially ovular shape (somewhat egg-shaped). Specifically, the narrower portion of the oval of the crank plate 480 is proximate to the disk collar 492 with the wider portion proximate to the spindle 430. The abrasive pad 490 is attached to the disk collar 492 using fasteners. The disk collar 492 is retained in the crank plate 480 by a swivel joint 494 that circumscribes the disk collar 492 within a disk hole formed in the crank plate 480. The swivel joint 494 may be formed from a polymer, such as nylon, and permits the abrasive pad 490 to adjust to the surface of the underlying pedestal if the underlying surface is slightly non-parallel with the baseplate 410.

The spindle 430 is attached to the crank plate 480 using fasteners. The spindle 430 is contained in a bushing 422 retained in a circular baseplate hole in the baseplate 410. The bushing 422 may be formed from Delrin or a similar polymer. The lower portion of the bushing 422 is separated from the crank plate 480. In some embodiments, a washer may be disposed on the crank plate 480 around the spindle 430, between the lower portion of the bushing 422 and the crank plate 480.

The revolving handle 440 is attached to the spindle 430 using a fastener 444 that couples the lower portion of the revolving handle 440 to the upper portion of the spindle 430. A cap 420 covers the baseplate hole and the bushing 422. The spindle 430 extends upward from the crank plate 480 through the bushing 422 into a circular cavity formed by the cap 420. The lever arm 446 of the revolving handle 440 contains a circular projection 448 that extends through a circular cap hole in the cap 420 to abut the spindle 430. The cap 420 is formed from a material sufficiently strong to resist vertical force applied to the handle 440, such as aluminum. Vertical force supplied to the revolving handle 440 is thus transferred to the baseplate 410 via the cap 420.

In addition, like the embodiment shown in FIGS. 3A-3D, in the embodiment shown in FIGS. 4A and 4B, a single abrasive pad 490 is used to clean the pedestal. Thus, when the revolving handle 440 is turned, the spindle 430 turns, turning the crank plate 480, which moves the abrasive pad 490. The abrasive pad 490 is at least about one half that of the baseplate 410 and/or of the underlying pedestal.

Figure 5A:
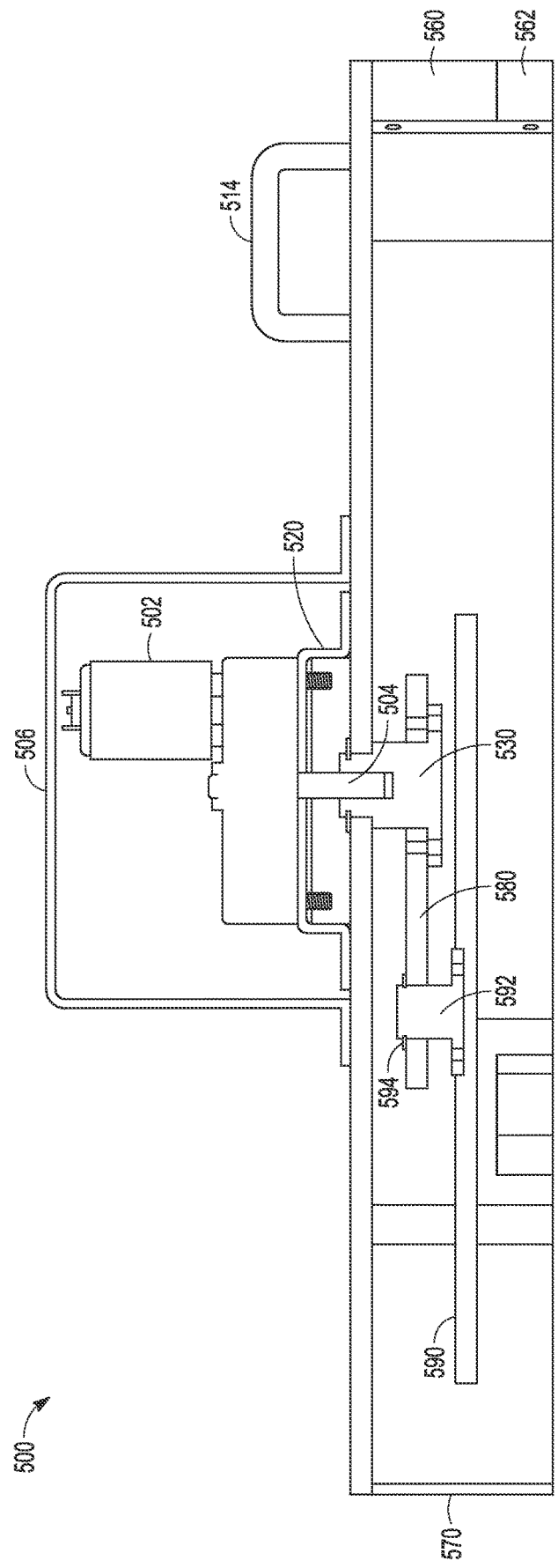
FIG. 5A is a schematic cross-sectional view of a portion of a top of a pedestal cleaning apparatus, according to another example embodiment.
Figure 5B:
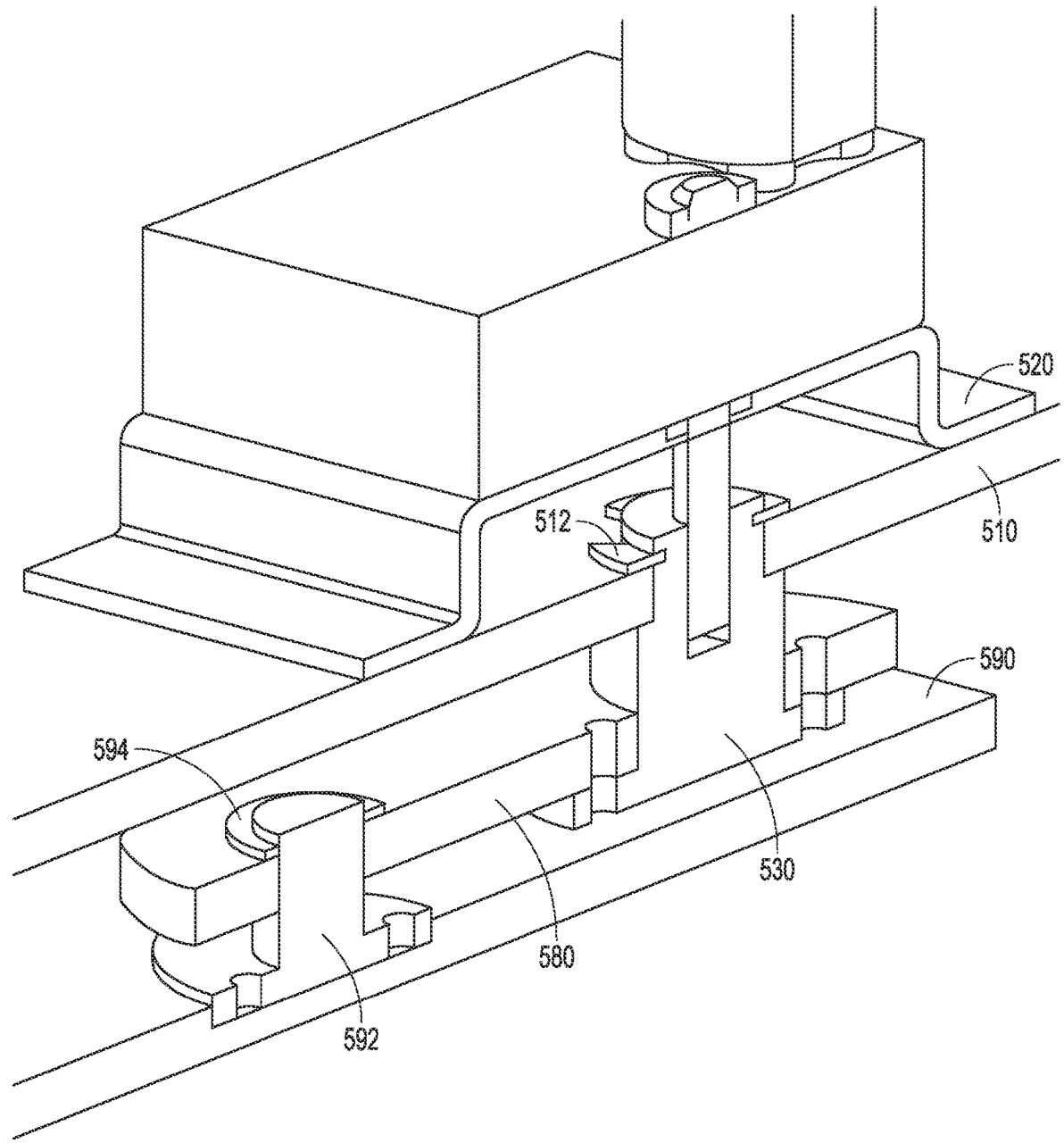
FIG. 5B is a perspective cross-sectional view of the pedestal cleaning apparatus of FIG. 5A.

FIG. 5A is a schematic cross-sectional view of a portion of a top of a pedestal cleaning apparatus, according to another example embodiment. FIG. 5B is a perspective cross-sectional view of the pedestal cleaning apparatus of FIG. 5A. The embodiment shown in FIGS. 5A and 5B is similar to that shown in FIGS. 3A-3D. Accordingly, although the top and bottom views of the embodiment in FIGS. 5A and 5B are not shown, similar elements are present as that shown in FIGS. 3A and 3B, other than those discussed below.

The cleaning apparatus 500 includes a baseplate 510 with a diameter larger than that of the pedestal on which the cleaning apparatus 500 is disposed. The baseplate 510 has at least one exhaust hole through which the dust from cleaning of the pedestals is removed using an exhaust port. The baseplate 510 has a pair of stationary handles 514 attached thereto for porting the cleaning apparatus 500 between pedestals or a storage area.

The baseplate 510 has feet 560 attached to the underside of the baseplate 510. The feet 560, as shown in FIG. 5A, each have a recess 562 into which an engaging member of the pedestal is inserted. A sealing mechanism 570 extends from a groove in the bottom of the baseplate 510 to seal the baseplate 510 to the pedestal during the cleaning process and contain the dust generated thereby within the cleaning apparatus 500. The sealing mechanism 570 may include the same elements as before (skirt/gasket) formed of the same materials. As in the embodiment of FIGS. 3A-3D, the sealing mechanism 570 does not extend around the entire circumference of the baseplate 510. Instead, as shown, the sealing mechanism 570 is formed in sections and the sections are attached to the feet 560. The feet 560 may be formed from Delrin, or a similar polymer.

Unlike the previous embodiments, however, the embodiment shown in FIGS. 5A and 5B contains neither a revolving handle nor cap. Instead, a motor 502 sits on a motor holder 520, both of which are covered by a motor cover 506. The motor 502 is connected to the abrasive pad 590 through an aluminum (or other similar material) crank plate 580. In more detail, the drive shaft 504 of the motor 502 is connected to the abrasive pad 590 through an aluminum (or other similar material) spindle 530, which connects the motor 502 to the crank plate 580, and a disk collar 592, which connects the crank plate 580 and the abrasive pad 590. The disk collar 592 may be formed from Delrin or a similar polymer. The crank plate 580 may be formed from aluminum and has a substantially ovular shape. The narrower portion of the oval of the crank plate 580 is proximate to the disk collar 592 with the wider portion proximate to the spindle 530. The abrasive pad 590 is attached to the disk collar 592 using fasteners. The disk collar 592 is retained in the crank plate 580 by a circular retainer 594 that circumscribes, and is partially disposed in a groove formed in, the disk collar 592—although in other embodiments, a swivel joint may be used, similar to the above.

The spindle 530 is attached to the crank plate 580 using fasteners. The spindle 530 may be retained on the baseplate 510 by a circular retainer 512 surrounding, and disposed within a groove formed in, the spindle 530.

In addition, like the embodiment shown in FIGS. 3A-3D, in the embodiment shown in FIGS. 5A and 5B, a single abrasive pad 590 is used to clean the pedestal. Thus, when the motor 502 turns, the spindle 530 turns, turning the crank plate 580, which moves the abrasive pad 590. The abrasive pad 590 is at least about one half that of the baseplate 510 and/or of the underlying pedestal.

To control the motor 502, in some embodiments, a number of rotations that the abrasive pads 590 would traverse the underlying pedestal may be determined to ensure that over-polishing of the pedestal does not occur. In some embodiments, the number of rotations of the motor 502 may be counted by an encoder attached to the motor 502. Since the motor 502 has a gearbox reduction, the number of turns to achieve polishing would be a large number. For example, assuming that 10 rotations of the motor shaft equals one turn of the disk (e.g., disk 180), to count off 5 turns of the disk, the controller counts 50 turns of the motor encoder. The motor power supply then shuts off after 5 turns of the disk. In this case, the operator may press an 'on' button of a wired or wireless controller again to start another round of 5 turns. The motor controller and power supply may have a setting between 1 and 7 turns to permit adjustment of the number of turns per power-up of the motor 502.

Alternatively, the motor 502 may be calibrated to determine how long power is to be supplied in order to achieve a predetermined number of turns. That is, rather than a number of turns, a time may be provided per activation. In yet another embodiment, a visual observation of a color spot on the disk passing a hole on the top of the fixture may be used. Such an embodiment may involve a camera or a sensor coupled to a processor to determine the number of revolutions.

Figure 6A:
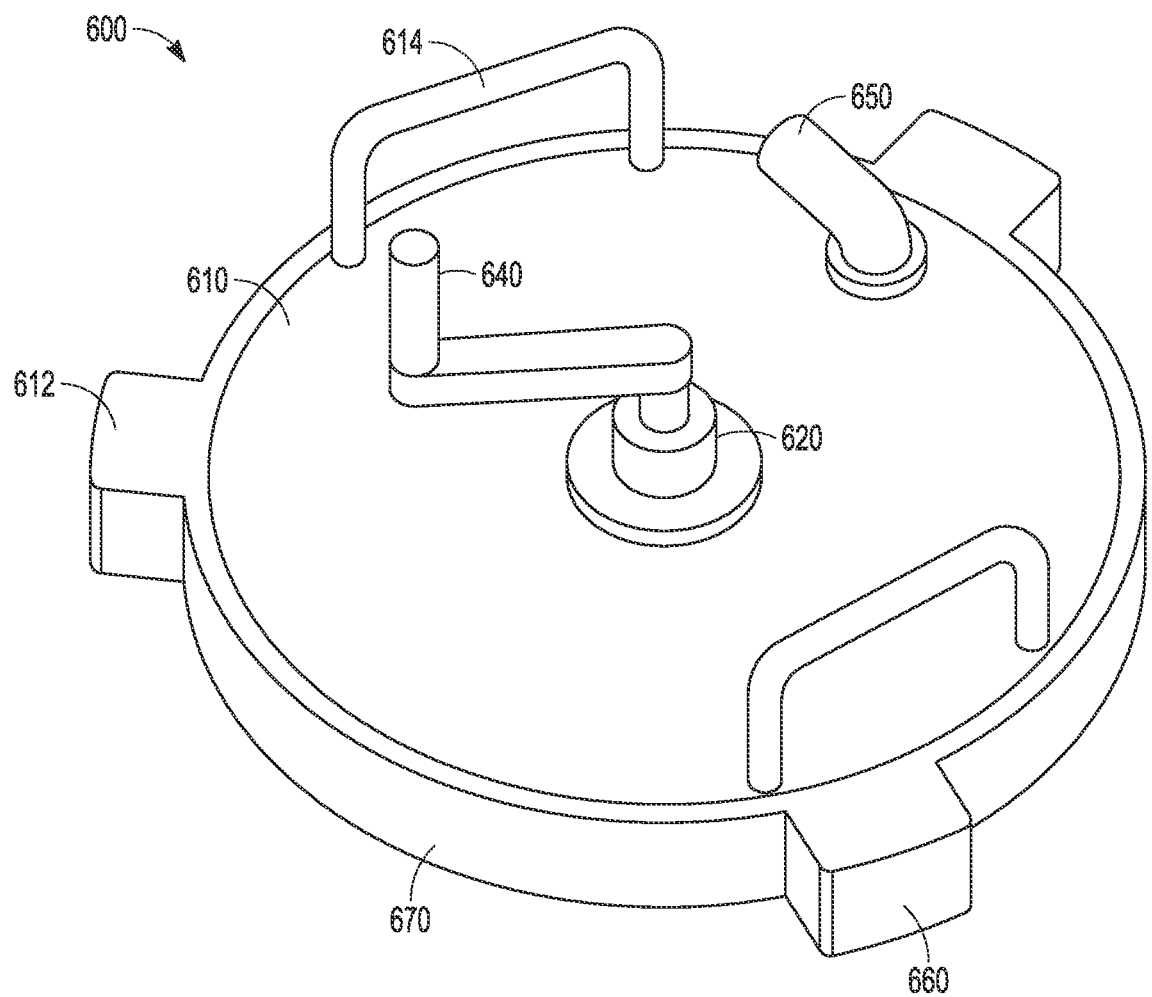
FIG. 6A is a perspective view of a top of a pedestal cleaning apparatus, according to another example embodiment.
Figure 6B:
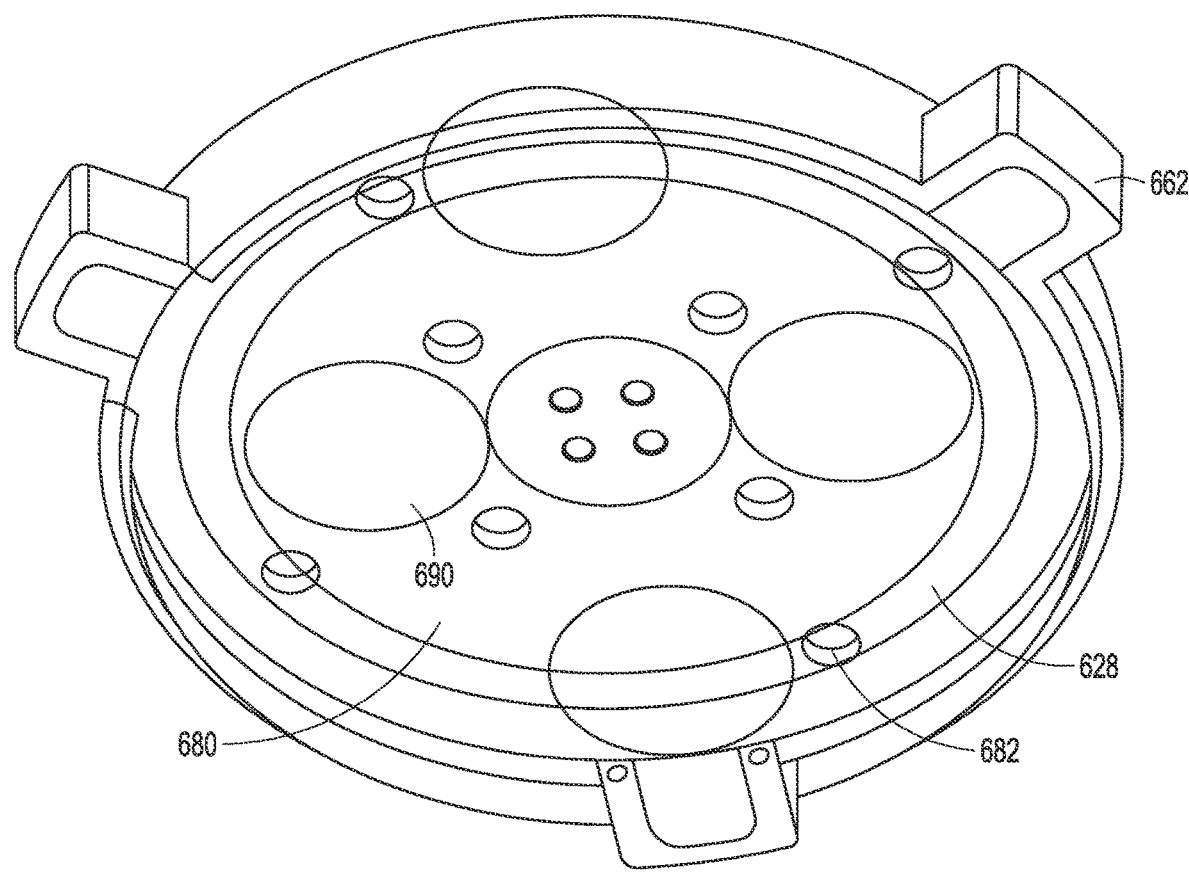
FIG. 6B is a perspective view of a bottom of the pedestal cleaning apparatus of FIG. 6A.
Figure 6C:
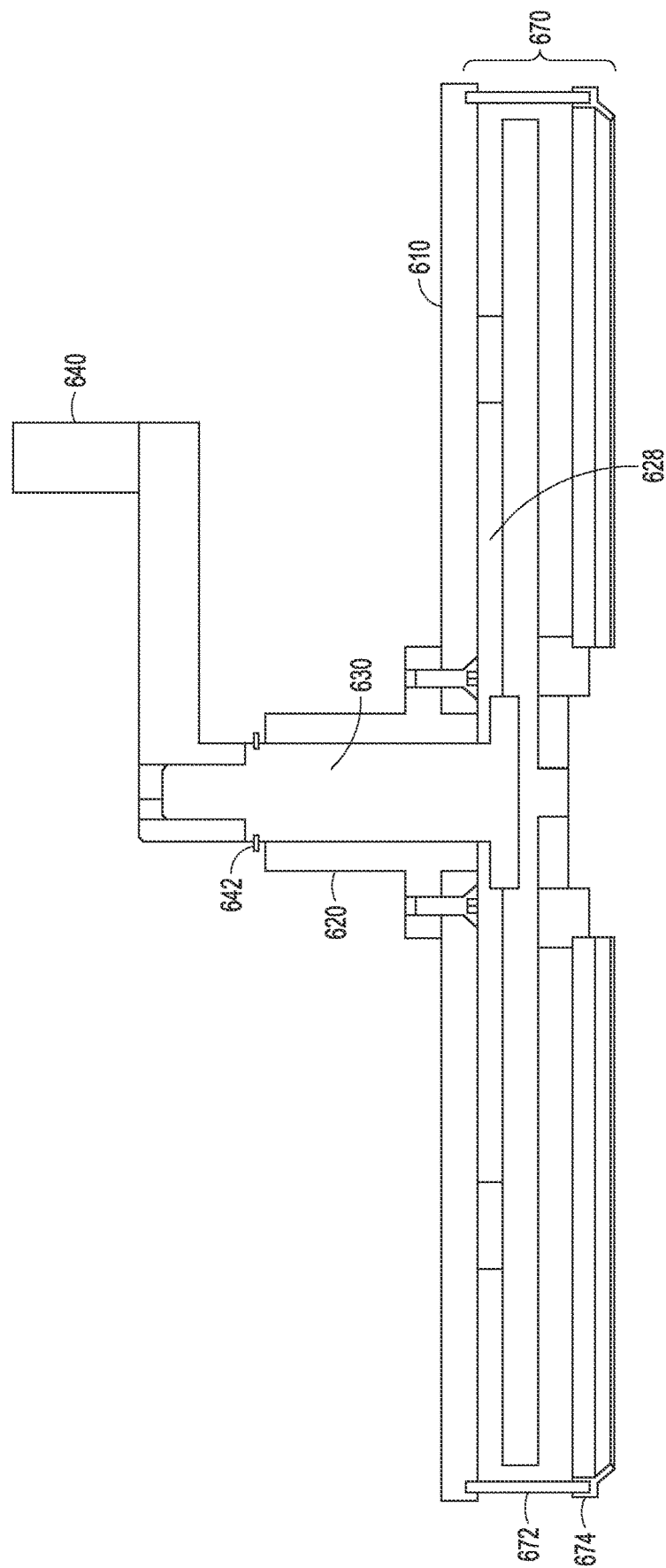
FIG. 6C is a cross-sectional view of a portion of the pedestal cleaning apparatus of FIG. 6A.
Figure 6D:
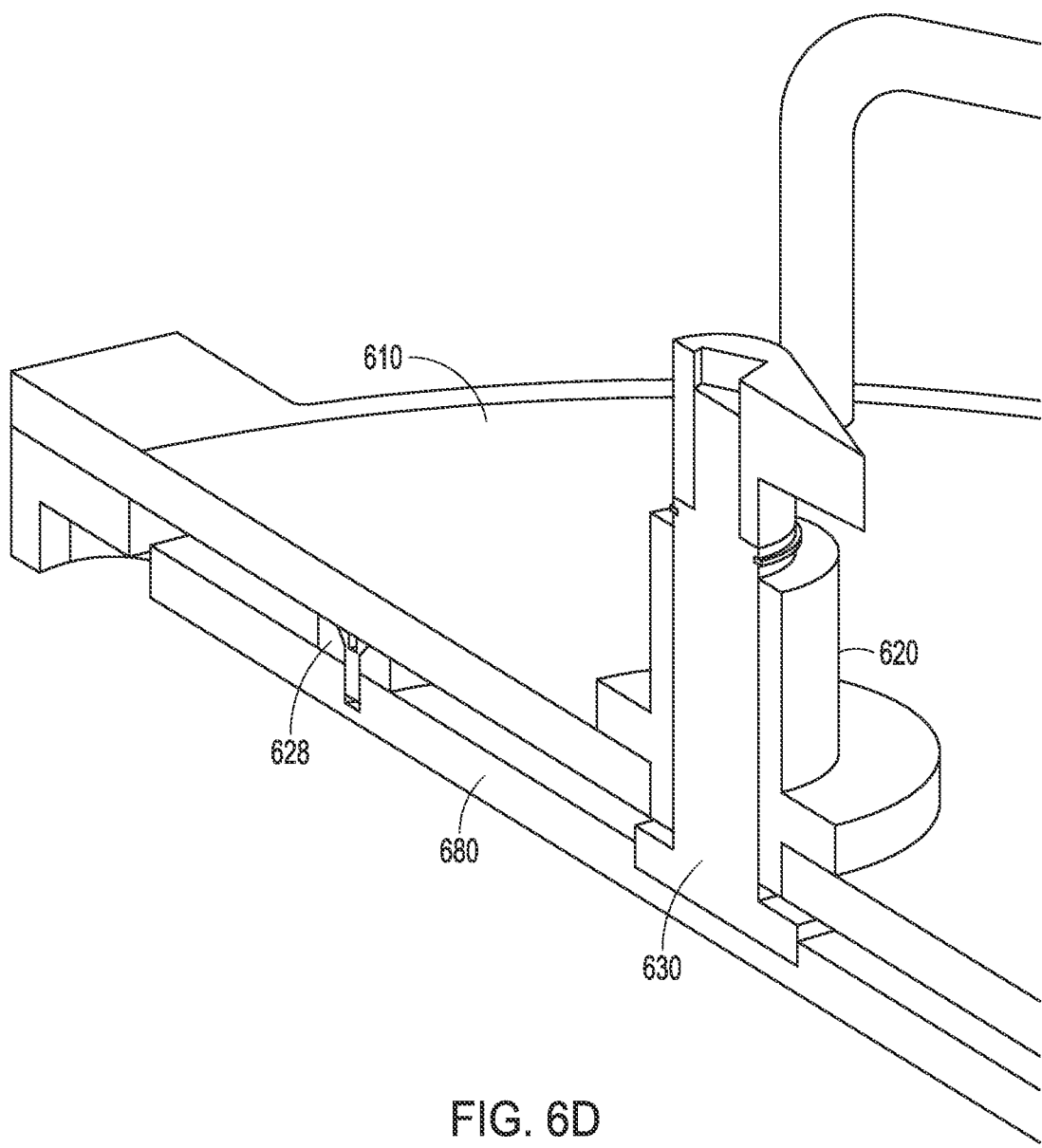
FIG. 6D is a schematic cross-sectional view of the pedestal cleaning apparatus of FIG. 6A.
Figure 6E:
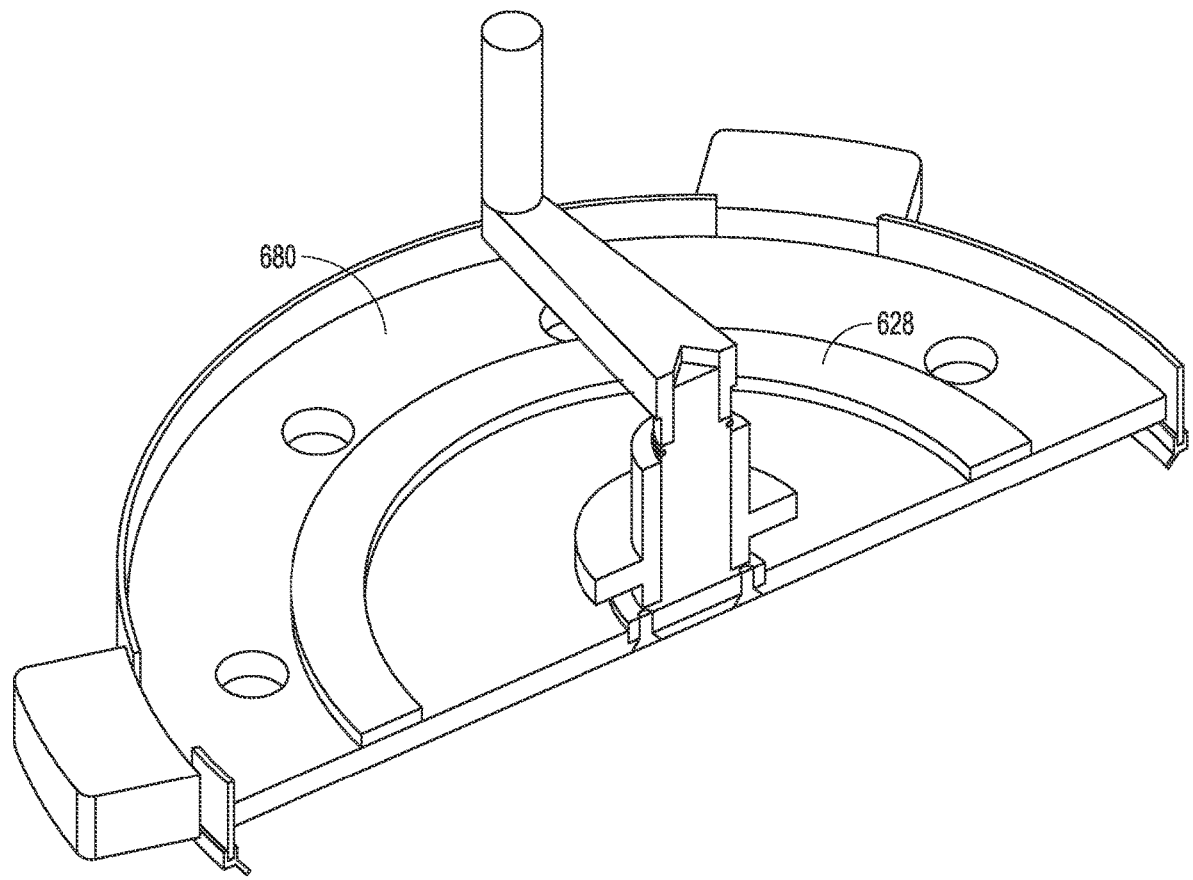
FIG. 6E is another perspective view of a top of the pedestal cleaning apparatus of FIG. 6A.

FIGS. 6A-6E show various views of a pedestal cleaning apparatus according to another example embodiment, in which FIG. 6A is a perspective view of a top of a pedestal cleaning apparatus, FIG. 6B is a perspective view of a bottom of the pedestal cleaning apparatus of FIG. 6A, FIG. 6C is a cross-sectional view of a portion of the pedestal cleaning apparatus of FIG. 6A, FIG. 6D is a schematic cross-sectional view of the pedestal cleaning apparatus of FIG. 6A, and FIG. 6E is another perspective view of a top of the pedestal cleaning apparatus of FIG. 6A. In particular, the view shown in FIG. 6E is that of the top of the pedestal cleaning apparatus with the baseplate removed.

As shown, the cleaning apparatus 600 includes a circular baseplate 610 with a diameter larger than that of the pedestal on which the cleaning apparatus 600 is disposed. The baseplate 610 has extensions 612 that extend from the circumference of the circle and match engaging members on the underlying pedestal through HDPE feet 660 to which the extensions 612 are attached. The underside of the feet 660, as shown in FIG. 6B, have a recess 662 into which the engaging members of the pedestal are inserted. The baseplate 610 also has aluminum stationary handles 614 attached thereto to enable a user to lift and carry the cleaning apparatus 600 from one pedestal to another or to a storage area. Similar to the embodiment shown in FIG. 1A, the extensions 612, feet 660 and stationary handles 614 are disposed at about 120° increments.

A sealing mechanism 670 extends from a bottom of the baseplate 610 to seal the baseplate 610 to the pedestal during the cleaning process and contain the dust generated thereby within the cleaning apparatus 600. The sealing mechanism 670, as best shown in FIG. 6C, contains a polycarbonate skirt 672 and a rubber gasket 674 attached to an end of the skirt 672. The skirt 672 is retained within a groove in the bottom surface of the baseplate 610. The diameter of the groove is larger than the diameter of the underlying pedestal, and thus of the disk 680 retaining the abrasive.

The baseplate 610 has at least one PVC exhaust port 650 through which the dust and debris from cleaning of the pedestals is removed using exhaust holes in the baseplate 610. When in operation, suction is applied to the exhaust port(s) 650 to remove the dust resulting from the cleaning operation. The height of the exhaust port 650 is lower than the rotatable handle 640, and the exhaust port 650 is disposed so that the dust removal provided by the exhaust port(s) 650 does not interfere with the rotation of the rotatable handle 640.

The aluminum disk 680, as shown in FIGS. 6B and 6C, contains multiple disk holes 682 that extend therethrough. As the disk 680 rotates, at least one of the disk holes 682 eventually partially or completely aligns with the exhaust hole(s) in the baseplate 610, as well as holes in a bearing 628 disposed between the baseplate 610 and the disk 680. The disk holes 682 have a regular grid pattern, with adjacent disk holes separated by a uniform center-to-center distance.

Abrasive pads 690 are pasted or otherwise attached to the disk 680. As the diameter of the pedestal is larger than that of each abrasive pad 690, multiple abrasive pads 690 are attached to the disk 680 at predefined marked locations. In particular, the abrasive pads 690 are attached to the disk 680 at locations that do not overlap any of the disk holes 682. As shown in FIG. 6B, five abrasive pads 690 are aligned in perpendicular directions. Specifically, one of the abrasive pads 690 is disposed in the center of the disk 680 such that the center of the abrasive pad 690 is aligned with the center of the disk 680. Two of the remaining abrasive pads 690 are tangential to the center abrasive pad 690 (separated by a fraction of an inch) in a first direction such that the centers of the tangential abrasive pads 690 are aligned in the first direction. The other two of the remaining abrasive pads 690 are separated from the center abrasive pad 690 in a second direction, perpendicular to the first direction, such that the centers of the separated abrasive pads 690 are aligned in the second direction. The separation between the separated abrasive pads 690 is less than the diameter of the abrasive pads 690. The abrasive pads 690 are thus disposed such that the entirety of the pedestal surface is covered at least once in a single rotation of the disk 680. Note that although five abrasive pads 690 are shown in FIG. 6B, in other embodiments, a different number of abrasive pads of the same size may be used (e.g., three) if disposed such that the entire surface of the pedestal is cleaned. The abrasive pads 690 may be formed from silicone to allow for even sanding of the underlying pedestal surface.

The disk 680, and thus abrasive pads 690, is rotated using a rotatable handle 640. The rotatable handle 640 is coupled, as shown in FIGS. 6C-6E, with the disk 680 through a stainless-steel spindle 630 disposed within a Delrin bushing 620 that is coupled to the baseplate 610. Relative rotational movement of the rotatable handle 640 thus rotates the abrasive pads 690, grinding down the deposits on the pedestal. The bearing 628 may be formed in a ring that is attached to the disk 680 in multiple locations around the ring. The bearing 628 may be formed from a non-stick material (e.g., polymer), such as Polytetrafluoroethylene (PTFE) or Teflon. The bearing 628 may be used to enhance rotation of the disk 680 when the handle 640 is rotated.

The spindle 630 is disposed through a baseplate hole in the baseplate 610, through the bushing 620 and projects from the bushing 620. In some embodiments, a cap similar to that shown in FIG. 1C may be present to cover the top of the bushing 620 and through the top of the spindle 630 to couple with the handle 640. The bushing 620 has a lower bushing portion attached to the baseplate 610 and an upper bushing portion through which the spindle 630 projects. In addition to being attached to the baseplate 610, the lower collar portion also extends through the baseplate hole formed to receive the bushing 620 and spindle 630.

The spindle 630 has a center spindle portion, a lower spindle portion attached to the disk 680, and an upper spindle portion to which the rotatable handle 640 is attached. The center spindle portion and lower spindle portion are circular, with a diameter of the center spindle portion being smaller than that of the lower spindle portion. The lower spindle portion is attached to the top of the disk 680. In some embodiments, as shown, a recess may be formed in the disk 680 to accommodate the lower spindle portion, the spindle 630 attached to the disk 680 within the recess. In some embodiments, the upper spindle portion has a square shape, with the rotatable handle 640 having a matching handle hole into which the upper spindle portion extends. The diameter of the square upper spindle portion is smaller than that of the circular center spindle portion.

A circular limiter 642 is disposed around the center spindle portion at an upper end of the center spindle portion. The circular limiter 642 may be, for example, disposed within a groove formed in an upper end of the center spindle portion and act as a stop for downward motion of the spindle 630.

In the embodiment shown in FIG. 6, the full weight of the cleaning apparatus. e.g., about 12 pounds, may contact the underlying pedestal. Instead of the collar shown in FIGS. 1A-1D isolating the hand-force, the entire weight of the cleaning apparatus 600 rests on the pedestal surface for increased polishing rate. However, this may also result in variability from one user to another when the cleaning apparatus is used. In addition, as the cleaning apparatus is heavy, the difficulty in turning the rotatable handle is increased as the full weight of the cleaning apparatus presses down upon the sandpaper while on the pedestal.

Note that in the embodiments above, the abrasive pads are shown as being circular. In other embodiments, the abrasive pads may be other shapes. For example, the abrasive pads may have a sector shape, similar to a slice of pizza. In this case, the pointed end of the slice would be towards the central shaft, and the pizza crust would be towards the outer periphery of the disk to which it is pasted. Since the outer periphery travels a longer linear distance, it sees greater sanding action, and hence a broader sanding pad at the periphery is used; and narrowing down towards the center, would provide uniform sanding rates/actions. Multiple sector pads around the disk would then perform polishing actions, as described above.

Figure 8:
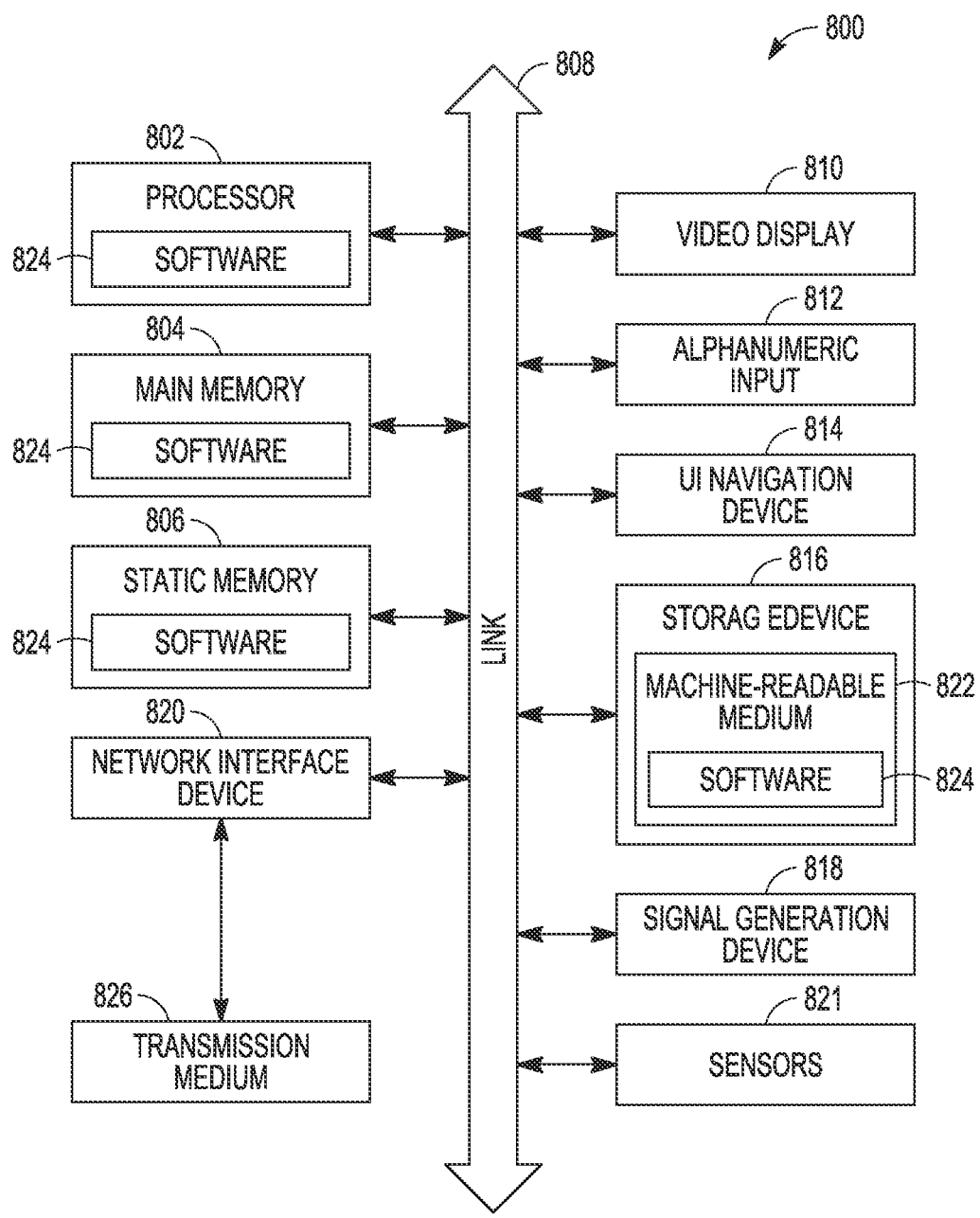
FIG. 8 is a machine, according to an example embodiment.

In some embodiments, the cleaning process may be automated, such that machines move the cleaning apparatus to and from the pedestal, as well as operate the cleaning by various circuitry and logic. FIG. 8 is a machine, according to an example embodiment. Examples, as described herein, may include, or may operate by, logic, a number of components, or mechanisms. Circuitry is a collection of circuits implemented in tangible entities that include hardware (e.g., simple circuits, gates, logic, etc.). Circuitry membership may be flexible over time and underlying hardware variability. Circuitry includes members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, by moveable placement of invariant massed particles, etc.) to encode instructions of the specific operation. In connecting the physical components, the underlying electrical properties of a hardware constituent are changed (for example, from an insulator to a conductor or vice versa). The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 800 may include a hardware processor 802 (e.g., a central processing unit (CPU), a hardware processor core, or any combination thereof), a graphics processing unit (GPU) (which may be part of the CPU or separate), a main memory 804, and a static memory 806, some or all of which may communicate with each other via an interlink (e.g., bus) 808. The machine 800 may further include a display device 810, an alphanumeric input device 812 (e.g., a keyboard), and a user interface (UI) navigation device 814 (e.g., a mouse). In an example, the display device 810, alphanumeric input device 812, and UI navigation device 814 may be a touch screen display. The machine 800 may additionally include a mass storage device (e.g., drive unit) 816, a signal generation device 818 (e.g., a speaker), a network interface device 820, and one or more sensors 821, such as a Global Positioning System (GPS) sensor, compass, accelerometer, or another sensor. The machine 800 may include transmission medium 828, such as a serial (e.g., universal serial bus (USB)), parallel, or other wired or wireless (e.g., infrared (IR), near field communication (NFC), etc.) connection to communicate with or control one or more peripheral devices (e.g., a printer, card reader, etc.).

The storage device 816 may include a machine-readable medium 822 on which is stored one or more sets of data structures or instructions 824 (referred to as software) embodying or utilized by any one or more of the techniques or functions described herein. The instructions 824 may also reside, completely or at least partially, within the main memory 804, within the static memory 806, within the hardware processor 802, or within the GPU, during execution thereof by the machine 800. In an example, one or any combination of the hardware processor 802, the GPU, the main memory 804, the static memory 806, or the mass storage device 816 may constitute machine-readable media.

While the machine-readable medium 822 is illustrated as a single medium, the term "machine-readable medium" may include a single medium or multiple media (e.g., a centralized or distributed database, and/or associated caches and servers) configured to store the one or more instructions 824.

The term "machine-readable medium" may include any medium that can store, encode, or carry the instructions 824 for execution by the machine 800 and that cause the machine 800 to perform any one or more of the techniques of the present disclosure, or that can store, encode, or carry data structures used by or associated with such instructions 824. Non-limiting machine-readable medium examples may include solid-state memories, and optical and magnetic media. In an example, a massed machine-readable medium comprises a machine-readable medium 822 with a plurality of particles having invariant (e.g., rest) mass. Accordingly, massed machine-readable media are not transitory propagating signals. Specific examples of massed machine-readable media may include non-volatile memory, such as semiconductor memory devices (e.g., Electrically Programmable Read-Only Memory (EPROM). Electrically Erasable Programmable Read-Only Memory (EEPROM)) and flash memory devices: magnetic disks, such as internal hard disks and removable disks: magneto-optical disks; and CD-ROM and DVD-ROM disks. The instructions 824 may further be transmitted or received over a communications network using a transmission medium 826 via the network interface device 820.

The processor 802, in conjunction with the memories 804, 806, may thus be used to operate the cleaning apparatus described. The display device 810, alphanumeric input device 812, UI navigation device 814, and signal generation device 818 may be used to notify the operator as to process of the cleaning, including completion or errors, as well as approximate amount of removal for each cleaning apparatus, perhaps using the sensors 821. The information may be provided to an operator (e.g., mobile device of the operator) via the network interface device 820. All of the mechanisms may be controlled when the instructions are 824 are executed by the processor 802.

Figure 9A:
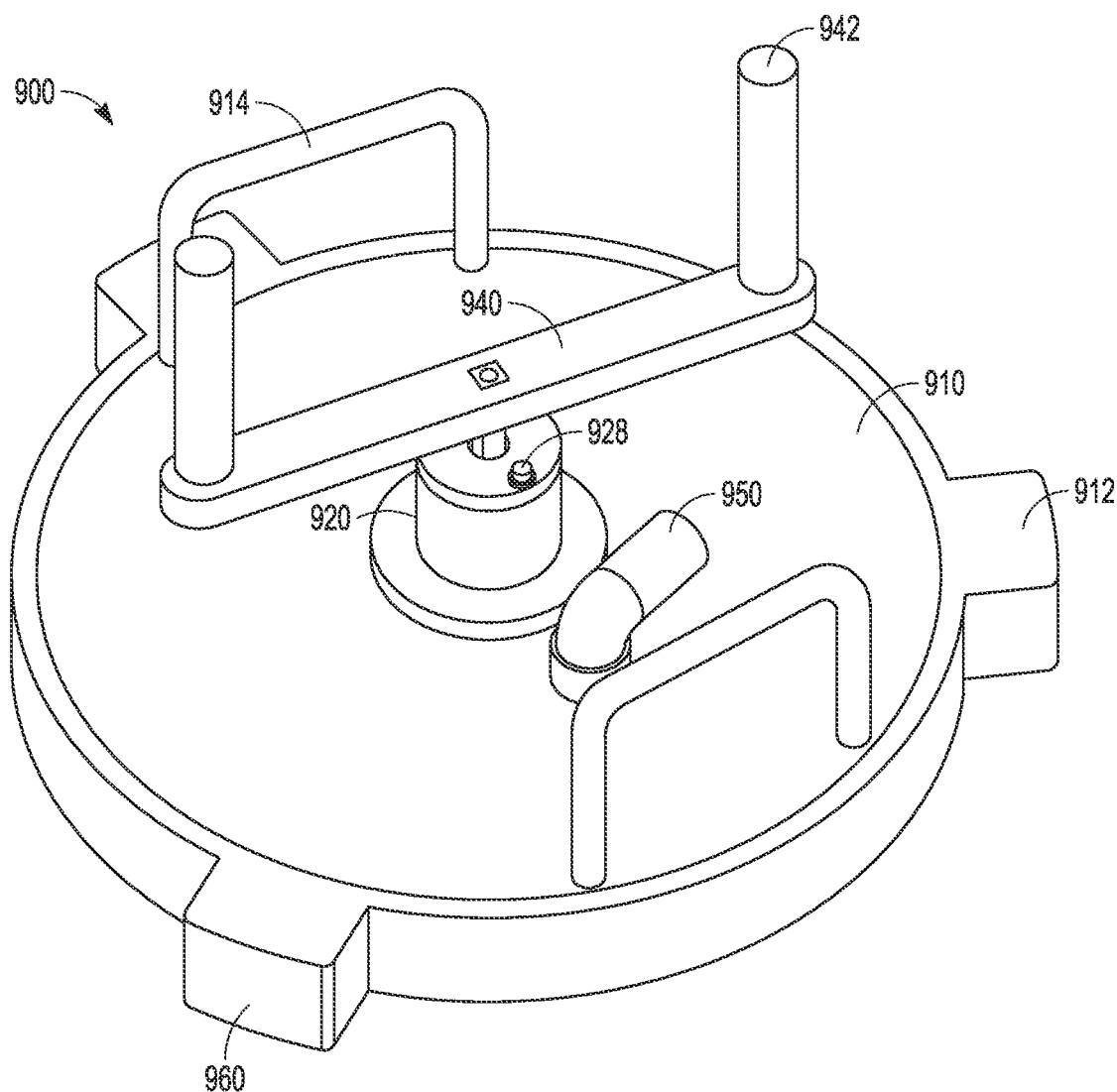
FIG. 9A is a perspective view of a top of a pedestal cleaning apparatus, according to an example embodiment.
Figure 9B:
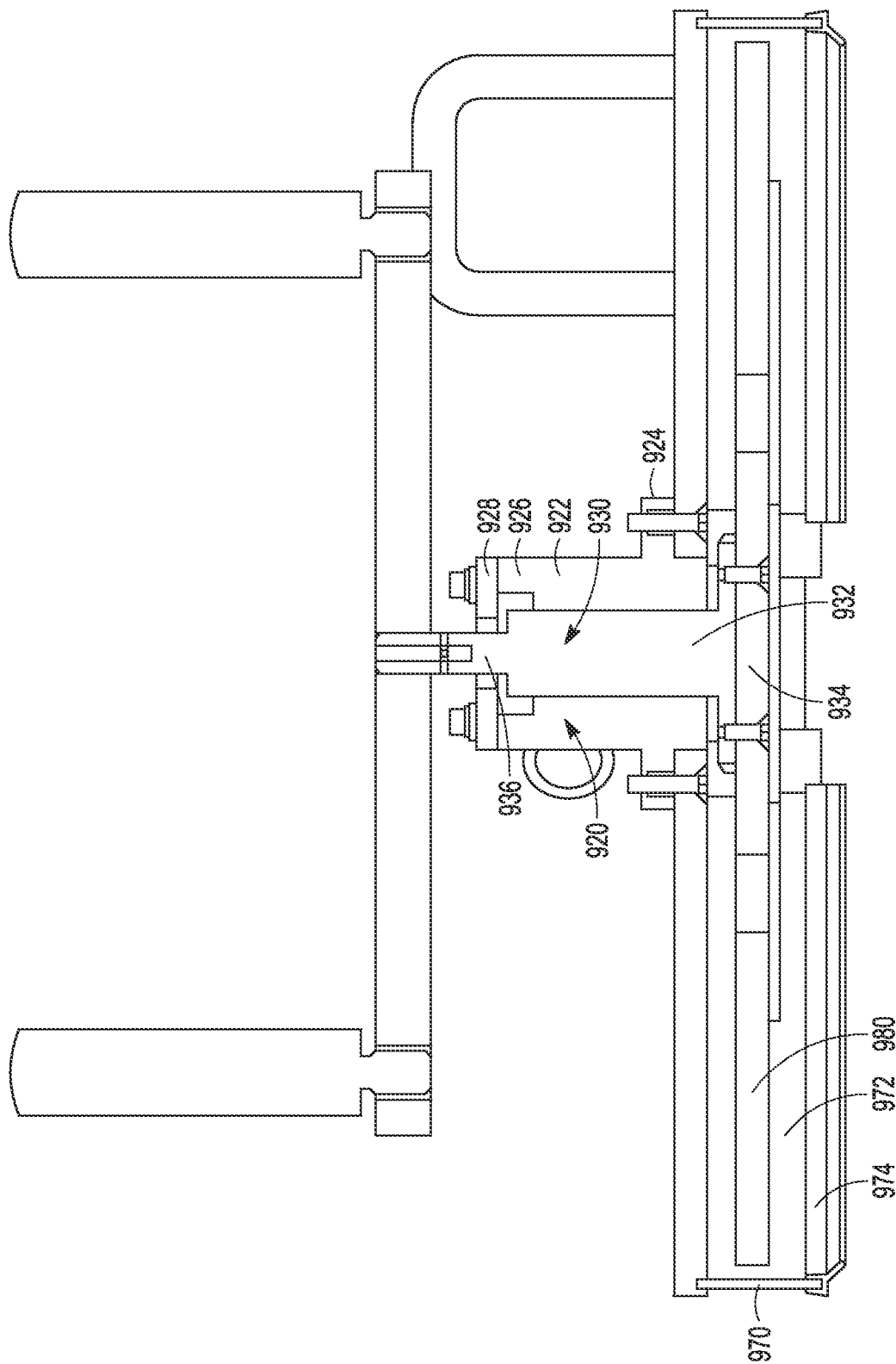
FIG. 9B is a schematic cross-sectional view of the pedestal cleaning apparatus of FIG. 9A.

In another embodiment, FIG. 9A is a perspective view of a top of a pedestal cleaning apparatus, according to an example embodiment: and FIG. 9B is a schematic cross-sectional view of the pedestal cleaning apparatus of FIG. 9A. FIGS. 9A and 9B are similar to the arrangements in the figures above and are thus labeled in a similar manner. That is, the cleaning apparatus 900 includes a circular baseplate 910 with extensions 912 that extend from the circumference of the circle. The extensions 912 are disposed to match engaging members on the underlying pedestal through feet 960 to which the extensions 912 are attached. The underside of the feet 960 have a recess into which the engaging members of the pedestal are inserted. The extensions 912 and feet 960 are uniformly disposed at the circumference of the circle—as shown at about 120° increments, although in other embodiments other numbers of extensions 912 and/or feet 960 or arrangements around the circumference may be used. The extensions 912 and feet 960 are secured together via fastening mechanisms such as screws.

The baseplate 910 has stationary handles 914 attached thereto to enable a user to lift and carry the cleaning apparatus 900 from one pedestal to another or to a storage area. As shown, the stationary handles 914 are disposed are uniformly disposed at the circumference of the circle—as shown at about 120° increments, although in other embodiments other numbers of stationary handles 914 or arrangements around the circumference may be used.

A sealing mechanism 970 extends from a bottom of the baseplate 910 to seal the baseplate 910 to the pedestal during the cleaning process and contain the dust generated thereby within the cleaning apparatus 900. The sealing mechanism 970, as best shown in FIG. 9B, contains a skirt 972 and a gasket 974 attached to an end of the skirt 972. The skirt 972 is retained within a groove in the bottom surface of the baseplate 910.

The baseplate 910 has, in addition, at least one exhaust port 950 through which the dust and debris from cleaning of the pedestals is removed using exhaust holes in the baseplate 910. When in operation, suction is applied to the exhaust ports 950 to remove the dust resulting from the cleaning operation. Note that the direction of extension, as well as the shape, of the exhaust ports 950 may be different. The height of the exhaust ports 950 is somewhat lower than the rotatable handle 940 so that the dust removal provided by the exhaust ports 950 does not interfere with the rotation of the rotatable handle 940.

The disk 980 may be formed from aluminum and contains multiple disk holes that extend therethrough. As the disk 980 rotates, at least one of the disk holes eventually partially or completely aligns with the exhaust holes in the baseplate 910, as well as holes in one or more weights disposed between the baseplate 910 and the disk 980.

The separation of the disk 980 from the baseplate 910 is provided by the float in the central shaft caused by the sizing of the various elements and associated tolerances. That is, even after assembling the weights, there is a gap between the baseplate 910 and the rings, so that the floating action of the handle 940 is retained. In some embodiments, each ring is narrow enough that it does not occlude the vacuum suction holes on the disk 980.

Abrasive pads are pasted or otherwise attached to the disk 980 as indicated in the above embodiments. The disk 980, and thus abrasive pads, is rotated using one or both manipulating handles 942 of a rotatable handle 940 that is coupled with the disk 980 through a coupling mechanism attached to a shaft 930 disposed within a collar 920 that is coupled to the baseplate 910. Relative rotational movement of the rotatable handle 940 thus rotates the abrasive pads 990, grinding down the deposits on the pedestal. The manipulating handles 942 are formed on opposite ends of a lever of the rotatable handle 940. Using a pair of manipulating handles 942 permits the rotatable handle 940 to be manually manipulated from one end of the cleaning apparatus 900 with enhanced uniformity. That is, a user operating the cleaning apparatus 900 from the side of the cleaning apparatus 900 may be able to grasp first one, and then the other, of the manipulating handles 942 with a shorter range of motion (compared to a single-manipulating handle embodiment in which a user's arm may reach full or near full extension at the farthest reach and then bend). It may also aid in a more uniform application of pressure, and thus grinding down of deposits on the underlying pedestal.

The collar 920 is terminated by a cap 928 that impedes the vertical (downward) movement of the rotatable handle 940 and thus force provided by the rotatable handle 940 in the vertical direction. The shaft 930 is disposed through a baseplate hole in the baseplate 910, a collar hole in the collar 920 and a cap hole in the cap 928. The collar 920 has a center collar portion 922, a lower collar portion 924 attached to the baseplate 910, and an upper collar portion 926 to which the cap 928 is attached, through all of which the shaft 930 extends. In addition to being attached to the baseplate 910, the lower collar portion 924 also extends through the baseplate hole.

The shaft 930 has a center shaft portion 932, a lower shaft portion 934 attached to the disk 980, and an upper shaft portion 936 to which the rotatable handle 940 is attached. The center shaft portion 932 and lower shaft portion 934 are circular, with a diameter of the center shaft portion 932 being smaller than that of the lower shaft portion 934. The lower shaft portion 934 is attached to the top of the disk 980. The upper shaft portion 936 extends through the cap hole in the cap 928 to couple with the rotatable handle 940. In some embodiments, the upper shaft portion 936 has a square shape, with the rotatable handle 940 having a matching handle hole into which the upper shaft portion 936 extends. The diameter of the square upper shaft portion 936 is smaller than that of the circular center shaft portion 932.

To retain the rotatable handle 940 in place during storage or transport, a retaining mechanism such as a ball-lock pin may be inserted into a top hole in a top shaft portion 938 of the upper shaft portion 936. A screw is disposed in the shaft portion hole to retain the coupling mechanism and the rotatable handle 940.

A collar hole through the collar 920 has an essentially uniform diameter (within mechanical tolerance) within the center collar portion 922 and the lower collar portion 924, expanding to a larger diameter in the upper collar portion 926. The center shaft portion 932 passes entirely through the hole in the center collar portion 922 and into the hole in the upper collar portion 926. A circular limiter 942 is disposed around the center shaft portion 932 at an upper end of the center shaft portion 932. The circular limiter 942 may be, for example, disposed within a groove formed in the upper end of the center shaft portion 932 and act as a stop for downward motion of the shaft 930. The use of the different diameters provided by the center collar portion 922 and the lower collar portion 924, along with the circular limiter 942 and the weights 984, may provide a vertical float to the disk 980 to ensure that the abrasive pads always contact the pedestal surface.

Example 1 is a cleaning apparatus comprising: a baseplate having a baseplate hole extending therethrough; a collar attached to the baseplate, the collar extending perpendicularly from the baseplate and through the baseplate hole, the collar having a collar hole extending perpendicularly through a center of the collar from a top of the collar to a bottom of the collar: a cap having a cap hole extending therethrough, the cap disposed on the collar such that a center of the cap hole and a center of the collar hole are collinear; a shaft that extends from the top of the collar through the cap hole, the collar hole and the baseplate hole: a rotatable handle attached to an upper portion of the shaft that extends from the cap hole, motion of the rotatable handle in a direction of extension of the collar hole impeded by the cap; a disk attached to a lower portion of the shaft and separated from a bottom of the baseplate; and at least one abrasive pad attached to the disk to remove buildup on a surface of an underlying pedestal.

In Example 2, the subject matter of Example 1 includes, wherein: the collar hole comprises a first collar hole portion proximate to the cap and having a first collar diameter and a second collar hole portion distal from the cap and having a second collar diameter, the first collar diameter larger than the second collar diameter, and the shaft comprises: a first shaft portion that extends from a top of the shaft through the cap hole into the first collar hole portion, the first shaft portion having a first shaft diameter, and a second shaft portion that extends from the first collar hole portion through the baseplate hole, the second shaft portion having a second shaft diameter larger than the first shaft diameter, the lower portion of the shaft having a third shaft diameter larger than the second shaft diameter.

In Example 3, the subject matter of Example 2 includes, a weight attached to the disk.

In Example 4, the subject matter of Example 3 includes, wherein: the weight is a weighted ring surrounding the lower portion of the shaft.

In Example 5, the subject matter of Examples 2-4 includes, wherein: the rotatable handle comprises a manipulating handle and a coupling mechanism, the coupling mechanism has a square hole through which the first shaft portion passes, and the first shaft portion has a square cross-section.

In Example 6, the subject matter of Example 5 includes, wherein: the second shaft portion has a circular cross-section.

In Example 7, the subject matter of Examples 5-6 includes, wherein: the first shaft portion has a first shaft portion hole therein, and a retaining mechanism is disposed in the first shaft portion hole to retain the manipulating handle.

In Example 8, the subject matter of Examples 1-7 includes, wherein: the at least one abrasive pad comprises a plurality of individual abrasive pads having a pad diameter smaller than a disk diameter of the disk, disposed to entirely cover an area of the disk over a single revolution.

In Example 9, the subject matter of Example 8 includes, wherein: exhaust ports are disposed on a top of the baseplate and connected to exhaust holes extending through the baseplate, the disk comprises a plurality of evenly spaced disk holes extending therethrough, and the number of disk holes is larger than the number of exhaust ports.

In Example 10, the subject matter of Example 9 includes, wherein: the individual abrasive pads are disposed between the disk holes and arranged such that an arc formed by an outer edge of one of the individual abrasive pads is tangential to an arc formed by an inner edge of another of the individual abrasive pads.

In Example 11, the subject matter of Examples 9-10 includes, wherein: the individual abrasive pads are disposed between the disk holes and arranged such that a first set of the individual abrasive pads are disposed linearly in a first direction and a second set of the individual abrasive pads are disposed linearly in a second direction perpendicular to the first direction, the first set of the individual abrasive pads in contact and the second set of the individual abrasive pads separated.

In Example 12, the subject matter of Examples 1-11 includes, wherein: the baseplate is substantially circular and has a plurality of extensions extending outward from a circumference of the circle, and feet extend from the extensions in a direction of the disk, the feet configured to couple with engaging members of the underlying pedestal.

In Example 13, the subject matter of Examples 1-12 includes, wherein: the baseplate and disk are substantially circular, a diameter of the baseplate larger than a diameter of the disk, the baseplate has a groove formed in the bottom of the baseplate, the groove has a larger diameter than the diameter of the disk, and a skirt is retained in the groove and extends from the baseplate beyond the disk.

In Example 14, the subject matter of Example 13 includes, a gasket disposed on an end of the skirt to seal a pedestal on which the cleaning apparatus is disposed.

Example 15 is a cleaning apparatus comprising: a baseplate having a baseplate hole extending therethrough; a cap attached to the baseplate and having a cap hole extending therethrough; a bushing disposed between the cap and the baseplate, and disposed in the baseplate hole, the bushing having a bushing hole extending therethrough; a spindle having an upper portion extending through the bushing hole into the cap hole; a crank plate having a central portion attached to a lower portion of the spindle and extending in a direction parallel with the baseplate to a distal portion; a disk collar attached to the distal portion of the crank plate; a disk attached to the disk collar, the disk having a diameter that is at least about one half a diameter of the baseplate; and an abrasive pad attached to the disk.

In Example 16, the subject matter of Example 15 includes, wherein: the baseplate and disk are substantially circular, a diameter of the baseplate larger than a diameter of the disk, the baseplate has a groove formed in a bottom of the baseplate, the groove having a larger diameter than the diameter of the disk, and a skirt is retained in the groove and extends from the baseplate beyond the disk.

In Example 17, the subject matter of Example 16 includes, a gasket disposed on an end of the skirt to seal a pedestal on which the cleaning apparatus is disposed.

In Example 18, the subject matter of Examples 16-17 includes, wherein: the baseplate is substantially circular and has a plurality of extensions extending inward from a circumference of the circle, and feet extend from the extensions in a direction of the disk, the feet configured to couple with engaging members of a pedestal on which the cleaning apparatus is disposed.

In Example 19, the subject matter of Examples 15-18 includes, wherein: exhaust holes extend through the baseplate.

In Example 20, the subject matter of Examples 15-19 includes, wherein: the disk collar comprises a swivel joint that keeps the disk level with a pedestal on which the cleaning apparatus is disposed.

In Example 21, the subject matter of Examples 15-20 includes, a manual crank having a handle and attached to an upper portion of the spindle.

In Example 22, the subject matter of Examples 15-21 includes, a motor spindle attached to an upper portion of the spindle, and a motor configured to drive the motor spindle.

Example 23 is a cleaning apparatus comprising: a baseplate having a baseplate hole extending therethrough; a bushing attached to the baseplate, the bushing extending perpendicularly from the baseplate and through the baseplate hole, the bushing having a bushing hole extending perpendicularly through a center of the bushing from a top of the bushing to a bottom of the bushing; a spindle that extends from the bottom of the bushing through the baseplate and bushing holes, projecting from the top of the bushing; a rotatable handle attached to an upper portion of the spindle that extends from the bushing; a disk attached to a lower portion of the spindle and separated from a bottom of the baseplate: a bearing ring disposed between the baseplate and disk to ease rotation of the disk; and abrasive pads attached to the disk to remove buildup on a surface of an underlying pedestal.

In Example 24, the subject matter of Example 23 includes, wherein the spindle comprises: a first spindle portion having a first spindle diameter, a second spindle portion that extends from the bushing hole through the baseplate hole and from the top of the bushing, the second spindle portion having a second spindle diameter larger than the first spindle diameter, and a third spindle portion attached to the disk and having a third spindle diameter larger than the second spindle diameter.

In Example 25, the subject matter of Example 24 includes, wherein: the rotatable handle comprises a manipulating handle and a coupling mechanism, the coupling mechanism has a square hole through which the first spindle portion passes, and the first spindle portion has a square cross-section.

In Example 26, the subject matter of Example 25 includes, wherein: the second spindle portion has a circular cross-section.

In Example 27, the subject matter of Examples 23-26 includes, wherein: the abrasive pads have a pad diameter smaller than a disk diameter of the disk, disposed to entirely cover an area of the disk over a single revolution.

In Example 28, the subject matter of Example 27 includes, wherein: an exhaust port is disposed on a top of the baseplate and connected to an exhaust hole extending through the baseplate, the disk comprises a plurality of evenly spaced disk holes extending therethrough, and the abrasive pads are disposed between the disk holes and arranged such that an arc formed by an outer edge of one of the abrasive pads is tangential to an arc formed by an inner edge of another of the abrasive pads.

In Example 29, the subject matter of Example 28 includes, wherein: the abrasive pads are disposed between the disk holes and arranged such that a first set of the abrasive pads are disposed linearly in a first direction and a second set of the abrasive pads are disposed linearly in a second direction perpendicular to the first direction, the first set of the abrasive pads in contact and the second set of the abrasive pads separated.

In Example 30, the subject matter of Examples 23-29 includes, wherein: the baseplate is substantially circular and has a plurality of extensions extending outward from a circumference of the circle, and feet extend from the extensions in a direction of the disk, the feet configured to couple with engaging members of the underlying pedestal.

In Example 31, the subject matter of Examples 23-30 includes, wherein: the baseplate and disk are substantially circular, a diameter of the baseplate larger than a diameter of the disk, the baseplate has a groove formed in the bottom of the baseplate, the groove has a larger diameter than the diameter of the disk, and a skirt is retained in the groove and extends from the baseplate beyond the disk.

In Example 32, the subject matter of Example 31 includes, a gasket is disposed on an end of the skirt to seal a pedestal on which the cleaning apparatus is disposed.

Example 33 is at least one machine-readable medium including instructions that, when executed by processing circuitry, cause the processing circuitry to perform operations to implement of any of Examples 1-32.

Example 34 is an apparatus comprising means to implement of any of Examples 1-32.

Example 35 is a system to implement of any of Examples 1-32.

Example 36 is a method to implement of any of Examples 1-32.

Example 37 is a method of cleaning a semiconductor polishing pedestal, the method comprising: lowering a cleaning apparatus onto a surface of the semiconductor polishing pedestal such that an abrasive pad of the cleaning apparatus contacts the semiconductor polishing pedestal, the cleaning apparatus comprising: a baseplate having a baseplate hole extending therethrough; a cap attached to the baseplate and having a cap hole extending therethrough; a bushing disposed between the cap and the baseplate, and disposed in the baseplate hole, the bushing having a bushing hole extending therethrough; a spindle having an upper portion extending through the bushing hole into the cap hole, a crank plate having a central portion attached to a lower portion of the spindle and extending in a direction parallel with the baseplate to a distal portion; a disk collar attached to the distal portion of the crank plate; a disk attached to the disk collar, the disk having a diameter that is at least about one half a diameter of the baseplate; and the abrasive pad attached to the disk; and driving the spindle to clean the surface of the semiconductor polishing pedestal using the abrasive pad.

In Example 38, the subject matter of Example 37 includes, at least one of maintaining the disk level with the semiconductor polishing pedestal using a swivel joint of the disk collar, or driving the spindle using a motor configured to drive a motor spindle attached to an upper portion of the spindle.

Example 39 is a system comprising: a cleaning apparatus comprising: a baseplate having a baseplate hole extending therethrough; a bushing attached to the baseplate, the bushing extending perpendicularly from the baseplate and through the baseplate hole, the bushing having a bushing hole extending perpendicularly through a center of the bushing from a top of the bushing to a bottom of the bushing: a spindle that extends from the bottom of the bushing through the baseplate and bushing holes, projecting from the top of the bushing; a rotatable handle attached to an upper portion of the spindle that extends from the bushing; a disk attached to a lower portion of the spindle and separated from a bottom of the baseplate; a bearing ring disposed between the baseplate and disk to ease rotation of the disk; and abrasive pads attached to the disk to remove buildup on a surface of an underlying pedestal; the underlying pedestal.

In Example 40, the subject matter of Example 39 includes, wherein the spindle comprises: a first spindle portion having a first spindle diameter, a second spindle portion that extends from the bushing hole through the baseplate hole and from the top of the bushing, the second spindle portion having a second spindle diameter larger than the first spindle diameter, and a third spindle portion attached to the disk and having a third spindle diameter larger than the second spindle diameter.

In Example 41, the subject matter of Example 40 includes, wherein: the rotatable handle comprises a manipulating handle and a coupling mechanism, the coupling mechanism has a square hole through which the first spindle portion passes, the first spindle portion has a square cross-section, and the second spindle portion has a circular cross-section.

While exemplary aspects of the subject matter discussed herein have been shown and described herein, it will be obvious to those skilled in the art that such embodiments are provided by way of example only. Numerous variations, changes, and substitutions will now occur to those skilled in the art, upon reading and understanding the material provided herein, without departing from the scope of the disclosed subject matter. It should be understood that various alternatives to the embodiments of the disclosed subject matter described herein may be employed in practicing the various embodiments of the subject matter.

Accordingly, the specification and drawings are to be regarded in an illustrative rather than a restrictive sense. The accompanying drawings that form a part hereof show, by way of illustration, and not of limitation, specific aspects in which the subject matter may be practiced. The aspects illustrated are described in sufficient detail to enable those skilled in the art to practice the teachings disclosed herein. Other aspects may be utilized and derived therefrom, such that structural and logical substitutions and changes may be made without departing from the scope of this disclosure. This Detailed Description, therefore, is not to be taken in a limiting sense, and the scope of various aspects is defined only by the appended claims, along with the full range of equivalents to which such claims are entitled. It is intended that the following claims define the scope of the disclosed subject matter and that methods and structures within the scope of these claims and their equivalents be covered thereby.

The abstract will allow the reader to quickly ascertain the nature of the technical disclosure. The abstract is submitted with the understanding that it will not be used to interpret or limit the scope or meaning of the claims. In addition, in the foregoing Detailed Description, it can be seen that various features are grouped together in a single aspect for the purpose of streamlining the disclosure. This method of disclosure is not to be interpreted as reflecting an intention that the claimed aspects require more features than are expressly recited in each claim. Rather, as the following claims reflect, inventive subject matter lies in less than all features of a single disclosed aspect. Thus, the following claims are hereby incorporated into the Detailed Description, with each claim standing on its own as a separate aspect.

What is claimed is:

1. A cleaning apparatus comprising:
a baseplate that has a baseplate hole that extends therethrough;
a collar attached to the baseplate, the collar extending from the baseplate and through the baseplate hole, the collar having a collar hole that extends through the collar from a first surface of the collar to a second surface of the collar;
a cap that has a cap hole that extends therethrough, the cap disposed on the collar;
a shaft that extends from the first surface of the collar through the cap hole, the collar hole and the baseplate hole;
a rotatable handle attached to a first portion of the shaft that extends from the cap hole, motion of the rotatable handle impeded by the cap in a direction of extension of the collar hole;
a disk attached to a second portion of the shaft and separated from a second surface of the baseplate; and
at least one abrasive pad attached to the disk to remove buildup on a surface of a pedestal,
wherein the collar hole comprises a first collar hole portion proximate to the cap and that has a first collar diameter and a second collar hole portion distal from the cap and that has a second collar diameter, the first collar diameter larger than the second collar diameter, and
the shaft comprises:
a first shaft portion that extends from a first surface of the shaft through the cap hole into the first collar hole portion, the first shaft portion that has a first shaft diameter, and
a second shaft portion that extends from the first collar hole portion through the baseplate hole, the second shaft portion that has a second shaft diameter larger than the first shaft diameter,
the second portion of the shaft that has a third shaft diameter larger than the second shaft diameter.

2. The cleaning apparatus of claim 1, further comprising a weighted ring attached to the disk, the weighted ring surrounding the second portion of the shaft.

3. The cleaning apparatus of claim 1, wherein:
the rotatable handle comprises a manipulating handle and a coupling mechanism,
the coupling mechanism has a square hole through which the first shaft portion passes, and
the first shaft portion has a square cross-section, and
at least one of:
the second shaft portion has a circular cross-section, or
the first shaft portion has a first shaft portion hole therein, and a retaining mechanism is disposed in the first shaft portion hole to retain the manipulating handle.

4. The cleaning apparatus of claim 1, wherein:
the at least one abrasive pad comprises a plurality of individual abrasive pads that has a pad diameter smaller than a disk diameter of the disk, disposed to entirely cover an area of the disk over a single revolution,
exhaust ports are disposed on a first surface of the baseplate and connected to exhaust holes that extends through the baseplate,
the disk comprises a plurality of evenly spaced disk holes that each extends therethrough, and
the number of disk holes is larger than the number of exhaust ports.

5. The cleaning apparatus of claim 4, wherein:
the individual abrasive pads are disposed between the disk holes and arranged such that an arc formed by an outer edge of one of the individual abrasive pads is tangential to an arc formed by an inner edge of another of the individual abrasive pads, or
the individual abrasive pads are disposed between the disk holes and arranged such that a first set of the individual abrasive pads are disposed linearly in a first direction and a second set of the individual abrasive pads are disposed linearly in a second direction perpendicular to the first direction, the first set of the individual abrasive pads in contact and the second set of the individual abrasive pads separated.

6. The cleaning apparatus of claim 1, wherein:
the baseplate is substantially circular and has a plurality of extensions that each extends outward from a circumference of the circle of the baseplate, and
feet extend from the extensions in a direction of the disk, the feet configured to couple with engaging members of the pedestal.

7. The cleaning apparatus of claim 1, wherein:
the baseplate and disk are substantially circular,
a diameter of the baseplate is larger than a diameter of the disk,
the baseplate has a groove formed in the second surface of the baseplate,
the groove has a larger diameter than the diameter of the disk,
a skirt is retained in the groove and extends from the baseplate beyond the disk, and
a gasket is disposed on an end of the skirt to seal a pedestal on which the cleaning apparatus is disposed.

8. A cleaning apparatus comprising:
a baseplate that has a baseplate hole that extends therethrough;
a cap attached to the baseplate and that has a cap hole that extends therethrough;
a bushing disposed between the cap and the baseplate, the bushing disposed in the baseplate hole and that has a bushing hole that extends therethrough;
a spindle that has a first portion that extends through the bushing hole into the cap hole;
a crank plate that has a central portion attached to a second portion of the spindle and that extends in a direction parallel with the baseplate to a distal portion of the crank plate;
a disk collar attached to the distal portion of the crank plate;
a disk attached to the disk collar, the disk having a diameter that is at least about one half a diameter of the baseplate; and
an abrasive pad attached to the disks
wherein
the first portion of the spindle has a first spindle diameter, and
the second portion of the spindle has a second spindle diameter larger than the first spindle diameter.

9. The cleaning apparatus of claim 8, wherein:
the baseplate and disk are substantially circular, a diameter of the baseplate larger than a diameter of the disk,
the baseplate has a groove formed in a second surface of the baseplate, the groove that has a larger diameter than the diameter of the disk,
a skirt is retained in the groove and extends from the baseplate beyond the disk, and
a gasket disposed on an end of the skirt to seal a pedestal on which the cleaning apparatus is disposed.

10. The cleaning apparatus of claim 8, wherein:
the baseplate is substantially circular and has a plurality of extensions that extends inward from a circumference of the circle of the baseplate, and
feet extend from the extensions in a direction of the disk, the feet configured to couple with engaging members of a pedestal on which the cleaning apparatus is disposed.

11. The cleaning apparatus of claim 8, wherein at least one of:
exhaust holes extend through the baseplate,
the disk collar comprises a swivel joint that keeps the disk level with a pedestal on which the cleaning apparatus is disposed, or
the cleaning apparatus further comprises at least one of: a manual crank that has a handle and is attached to a first portion of the spindle, or
a motor spindle attached to a first portion of the spindle, and a motor configured to drive the motor spindle.

12. A cleaning apparatus comprising:
a baseplate that has a baseplate hole that extends therethrough,
a bushing attached to the baseplate and that extends from the baseplate and through the baseplate bole, the bushing having a bushing hole that extends through the bushing from a first surface of the bushing to a second surface of the bushing;
a spindle that extends from the second surface of the bushing through the baseplate and bushing holes, the spindle projecting from the first surface of the bushing;
a rotatable handle attached to a first portion of the spindle that extends from the bushing;
a disk attached to a second portion of the spindle, the disk separated from a second surface of the baseplate;
a bearing ring disposed between the baseplate and disk; and abrasive pads attached to the disk,
wherein the spindle comprises:
    a first spindle portion that has a first spindle diameter,
    a second spindle portion that extends from the bushing hole through the baseplate hole and from the first surface of the bushing,
    the second spindle portion that has a second spindle diameter larger than the first spindle diameter, and
    a third spindle portion attached to the disk and that has a third spindle diameter larger than the second spindle diameter.

13. The cleaning apparatus of claim 12, wherein:
the rotatable handle comprises a manipulating handle and a coupling mechanism,
the coupling mechanism has a square hole through which the first spindle portion passes, and
the first spindle portion has a square cross-section.

14. The cleaning apparatus of claim 12, wherein:
the abrasive pads have a pad diameter smaller than a disk diameter of the disk, disposed to entirely cover an area of the disk over a single revolution.

15. The cleaning apparatus of claim 14, wherein:
an exhaust port is disposed on a first surface of the baseplate,
the exhaust port is connected to an exhaust hole that extends through the baseplate,
the disk comprises a plurality of evenly spaced disk holes that each extends therethrough, and
the abrasive pads are disposed between the disk holes and arranged such that an arc formed by an outer edge of one of the abrasive pads is tangential to an arc formed by an inner edge of another of the abrasive pads.

16. The cleaning apparatus of claim 15, wherein:
the abrasive pads are disposed between the disk holes,
the abrasive pads arranged such that a first set of the abrasive pads are disposed linearly in a first direction and a second set of the abrasive pads are disposed linearly in a second direction perpendicular to the first direction, and
the first set of the abrasive pads are in contact and the second set of the abrasive pads are separated.

17. The cleaning apparatus of claim 12, wherein:
the baseplate is substantially circular and has a plurality of extensions that each extends outward from a circumference of the circle of the baseplate,
feet extend from the extensions in a direction of the disk, and
the feet are configured to couple with engaging members of a pedestal on which the cleaning apparatus is disposed.

18. The cleaning apparatus of claim 12, wherein:
the baseplate and disk are substantially circular,
a diameter of the baseplate is larger than a diameter of the disk,
the baseplate has a groove formed in the second surface of the baseplate,
the groove has a larger diameter than the diameter of the disk,
a skirt is retained in the groove and extends from the baseplate beyond the disk, and
a gasket is disposed on an end of the skirt to seal a pedestal on which the cleaning apparatus is disposed.

19. A cleaning apparatus comprising:
a baseplate that has a baseplate hole that extends therethrough;
a collar attached to the baseplate, the collar extending from the baseplate and through the baseplate hole, the collar having a collar hole that extends through the collar from a first surface of the collar to a second surface of the collar;
a cap that has a cap hole that extends therethrough, the cap disposed on the collar;
a shaft that extends from the first surface of the collar through the cap hole, the collar hole and the baseplate hole;
a rotatable handle attached to a first portion of the shaft that extends from the cap hole, motion of the rotatable handle impeded by the cap in a direction of extension of the collar hole;
a disk attached to a second portion of the shaft and separated from a second surface of the baseplate; and
a plurality of individual abrasive pads attached to the disk to remove buildup on a surface of a pedestal, the disk comprises a plurality of evenly spaced disk holes,
wherein
    the individual abrasive pads are disposed between the disk holes and arranged such that an arc formed by an outer edge of one of the individual abrasive pads is tangential to an arc formed by an inner edge of another of the individual abrasive pads, or
the individual abrasive pads are disposed between the disk holes and arranged such that a first set of the individual abrasive pads are disposed linearly in a first direction and a second set of the individual abrasive pads are disposed linearly in a second direction perpendicular to the first direction, the first set of the individual abrasive pads in contact and the second set of the individual abrasive pads separated.

20. A cleaning apparatus comprising:
a baseplate that has a baseplate hole that extends therethrough;
a collar attached to the baseplate, the collar extending from the baseplate and through the baseplate hole, the collar having a collar hole that extends through the collar from a first surface of the collar to a second surface of the collar;
a cap that has a cap hole that extends therethrough, the cap disposed on the collar;
a shaft that extends from the first surface of the collar through the cap hole, the collar hole and the baseplate hole;
a rotatable handle attached to a first portion of the shaft that extends from the cap hole, motion of the rotatable handle impeded by the cap in a direction of extension of the collar hole;
a disk attached to a second portion of the shaft and separated from a second surface of the baseplate; and
a plurality of individual abrasive pads attached to the disk to remove buildup on a surface of a pedestal,
wherein
the disk comprises a plurality of evenly spaced disk holes that each extends therethrough, and
the abrasive pads are disposed between the disk holes and arranged such that an arc formed by an outer edge of one of the abrasive pads is tangential to an arc formed by an inner edge of another of the abrasive pads.

21. A manual cleaning apparatus comprising:
a baseplate that has a baseplate hole that extends therethrough;
a collar attached to the baseplate, the collar extending from the baseplate and through the baseplate hole, the collar having a collar hole that extends through the collar from a first surface of the collar to a second surface of the collar;
a cap that has a cap hole that extends therethrough, the cap disposed on the collar;
a shaft that extends from the first surface of the collar through the cap hole, the collar hole and the baseplate hole;
a rotatable handle directly attached to a first portion of the shaft that extends from the cap hole, motion of the rotatable handle impeded by the cap in a direction of extension of the collar hole;
a disk attached to a second portion of the shaft and separated from a second surface of the baseplate; and
a plurality of individual abrasive pads attached to the disk to remove buildup on a surface of a pedestal,
wherein a rotation of the rotatable handle causes the disk to rotate.

22. A cleaning apparatus comprising:
a baseplate that has a baseplate hole that extends therethrough;
a bushing attached to the baseplate and that extends from the baseplate and through the baseplate hole, the bushing having a bushing hole that extends through the bushing from a first surface of the bushing to a second surface of the bushing;
a spindle that extends from the second surface of the bushing through the baseplate and bushing holes, the spindle projecting from the first surface of the bushing;
a rotatable handle attached to a first portion of the spindle that extends from the bushing;
a disk attached to a second portion of the spindle, the disk separated from a second surface of the baseplate;
a bearing ring disposed between the baseplate and disk; and
abrasive pads attached to the disk,
wherein
the disk comprises a plurality of evenly spaced disk holes that each extends therethrough, and
the abrasive pads are disposed between the disk holes and arranged such that an arc formed by an outer edge of one of the abrasive pads is tangential to an arc formed by an inner edge of another of the abrasive pads, or
the abrasive pads are disposed between the disk holes and arranged such that a first set of the abrasive pads are disposed linearly in a first direction and a second set of the abrasive pads are disposed linearly in a second direction perpendicular to the first direction, the first set of the abrasive pads in contact and the second set of the abrasive pads separated.

23. A cleaning apparatus comprising:
a baseplate that has a baseplate hole that extends therethrough;
a bushing attached to the baseplate and that extends from the baseplate and through the baseplate hole, the bushing having a bushing hole that extends through the bushing from a first surface of the bushing to a second surface of the bushing;
a spindle that extends from the second surface of the bushing through the baseplate and bushing holes, the spindle projecting from the first surface of the bushing;
a rotatable handle attached to a first portion of the spindle that extends from the bushing;
a disk attached to a second portion of the spindle, the disk separated from a second surface of the baseplate;
a bearing ring disposed between the baseplate and disk; and
abrasive pads attached to the disk,
wherein
the disk comprises a plurality of evenly spaced disk holes that each extends therethrough, and
the abrasive pads are disposed between the disk holes and arranged such that an arc formed by an outer edge of one of the abrasive pads is tangential to an arc formed by an inner edge of another of the abrasive pads.

24. A manual cleaning apparatus comprising:
a baseplate that has a baseplate hole that extends therethrough;
a bushing attached to the baseplate and that extends from the baseplate and through the baseplate hole, the bushing having a bushing hole that extends through the bushing from a first surface of the bushing to a second surface of the bushing;
a spindle that extends from the second surface of the bushing through the baseplate and bushing holes, the spindle projecting from the first surface of the bushing;
a rotatable handle directly attached to a first portion of the spindle that extends from the bushing;
a disk attached to a second portion of the spindle, the disk separated from a second surface of the baseplate;
a bearing ring disposed between the baseplate and disk; and
abrasive pads attached to the disk,
wherein a rotation of the rotatable handle causes the disk to rotate.

* * * * *